US007235311B2

(12) United States Patent
Kathirgamanathan et al.

(10) Patent No.: US 7,235,311 B2
(45) Date of Patent: Jun. 26, 2007

(54) ELECTROLUMINESCENT DEVICES INCORPORATING MIXED METAL ORGANIC COMPLEXES

(75) Inventors: Poopathy Kathirgamanathan, North Harrow (GB); Seenivasagam Ravichandran, Surrey (GB); Sivagnasundram Surendrakumar, London (GB)

(73) Assignee: Oled-T Limited, Enfield (GB)

( * ) Notice: Subject to any disclaimer, the term of this patent is extended or adjusted under 35 U.S.C. 154(b) by 269 days.

(21) Appl. No.: 10/475,627

(22) PCT Filed: Apr. 22, 2002

(86) PCT No.: PCT/GB02/01844

§ 371 (c)(1),
(2), (4) Date: Jan. 16, 2004

(87) PCT Pub. No.: WO02/087283

PCT Pub. Date: Oct. 31, 2002

(65) Prior Publication Data

US 2004/0137264 A1    Jul. 15, 2004

(30) Foreign Application Priority Data

Apr. 20, 2001    (GB) ................. 0109755.9

(51) Int. Cl.
*H01L 51/54* (2006.01)
(52) U.S. Cl. ................... 428/690; 428/917; 313/504; 313/506; 257/E51.041; 257/E51.042; 257/E51.043; 257/E51.044
(58) Field of Classification Search ................ None
See application file for complete search history.

(56) References Cited

U.S. PATENT DOCUMENTS

| | | | |
|---|---|---|---|
| 4,356,429 A | 10/1982 | Tang | |
| 4,455,364 A | 6/1984 | Sasa | |
| 4,720,432 A | 1/1988 | VanSlyke et al. | |
| 4,885,211 A | 12/1989 | Tang et al. | |
| 5,128,587 A | 7/1992 | Skotheim et al. | |
| 5,281,489 A | 1/1994 | Mori et al. | |
| 5,755,999 A | 5/1998 | Shi et al. | |
| 5,757,026 A | 5/1998 | Forrest et al. | |
| 5,807,627 A | 9/1998 | Friend et al. | |
| 6,153,726 A | 11/2000 | Kathirgamanathan et al. | |
| 6,489,638 B2* | 12/2002 | Seo et al. ................ | 257/98 |
| 6,572,987 B2* | 6/2003 | Seo ........................ | 428/690 |
| 6,783,873 B2* | 8/2004 | Tsuboyama et al. ...... | 428/690 |
| 6,787,249 B2* | 9/2004 | Seo ........................ | 428/690 |
| 2001/0019782 A1* | 9/2001 | Igarashi et al. ........... | 428/690 |
| 2003/0215669 A1* | 11/2003 | Kathirgamanathan et al. ................ | 428/690 |
| 2004/0023062 A1* | 2/2004 | Kathirgamanathan et al. ................ | 428/690 |
| 2004/0026663 A1* | 2/2004 | Heuer et al. ............ | 252/301.16 |
| 2004/0197600 A1* | 10/2004 | Thompson et al. ....... | 428/690 |
| 2004/0253477 A1* | 12/2004 | Kathirgamanathan et al. ................ | 428/690 |

FOREIGN PATENT DOCUMENTS

| | | |
|---|---|---|
| EP | 0 087 309 A | 8/1983 |
| EP | 0 278 629 A | 8/1988 |
| EP | 0 461 542 A | 12/1991 |
| EP | 0 556 005 A | 8/1993 |
| EP | 0 569 827 A | 11/1993 |
| EP | 0 744 451 A | 11/1996 |
| EP | 0 936 844 A | 8/1999 |
| JP | 61037887 | 2/1986 |
| JP | 1-256584 | 10/1987 |
| JP | 1-282291 | 11/1987 |
| JP | 06 145146 A | 5/1999 |
| WO | WO 90/13148 | 11/1990 |
| WO | WO 98/02018 | 1/1998 |
| WO | WO 98/55561 | 12/1998 |
| WO | WO 98/58037 | 12/1998 |
| WO | WO 00/26323 | 5/2000 |
| WO | WO 00/32717 | 6/2000 |
| WO | WO 00/32718 | 6/2000 |
| WO | WO 00/32719 | 6/2000 |
| WO | WO 00/44851 | 8/2000 |
| WO | WO 02/43444 | 5/2002 |
| WO | WO 02/43446 | 5/2002 |
| WO | WO 02/43447 | 5/2002 |
| WO | WO 02/086014 | 10/2002 |
| WO | WO 02/086015 | 10/2002 |
| WO | WO 02/087283 | 10/2002 |
| WO | WO 02/087288 | 10/2002 |
| WO | WO 02/090465 | 11/2002 |

(Continued)

OTHER PUBLICATIONS

Y. Hamada, et al., Blue Electroluminescence in Thin Films of Azomethin-Zinc Complexes, Japanese Journal of Applied Physics, vol. 32, Apr. 1, 1993, No. 4A, pp. L511-L513.

M. Berggren, et al., Ultraviolet Electroluminescence from an Organic Light Emitting Diode, Advance Materials, 7 (1995), November No. 11; pp. 900-903.

N. Armaroli, Luminescence properties of Eu3+, Tb3-, and Gd3+ complexes of the hexadentate N-donor podand tris-[3-(2-pyridyl) pyrazol-lyl] hydroborate, Chemical Physics Letters 276, Sep. 26, 1997, pp. 435-440.

N.C. Greenham, et al., Measurement of absolute photoluminescence quantum efficiencies in conjugated polymers, Chemical Physics Letters, Jul. 1995, 241, pp. 89-96.

(Continued)

*Primary Examiner*—Marie Yamnitzky
(74) *Attorney, Agent, or Firm*—David Silverstein; Andover-IP-Law

(57) ABSTRACT

An electroluminescent device in which there is an electroluminescent which comprises a complex of general formula $(L_\alpha)_n M_1 M_2$ or of general formula $(L_\alpha)_n M_1 M_2 (L_p)$, where $L_p$ is a neutral ligand and where $M_1$ is a rare earth, transition metal, lanthamide or an actinide, $M_2$ is a non rare earth metal, $L_\alpha$ is an organic complex and n is the combined valence state of $M_1$ and $M_2$.

11 Claims, 30 Drawing Sheets

FOREIGN PATENT DOCUMENTS

| WO | WO 02/090466 | 11/2002 |
| WO | WO 02/091493 | 11/2002 |
| WO | WO 02/102924 | 12/2002 |
| WO | WO 03/006573 | 1/2003 |
| WO | WO 03/014256 | 2/2003 |

OTHER PUBLICATIONS

L. Liu, et al., Europium complexes as emitters in organic electroluminescent devices, Synthetic Metals 91, 1997, pp. 267-269.

S. Dirr, et al., Luminescence enhancement in microcavity organic multiplayer structures, Synthetic Metals, 9, 1997, pp. 53-56.

J. Kido, et al., White-Light Emitting Organic Electroluminescent Device Using Lanhanide Complexes, Japanese Journal of Applied Physics No. 35, 1996, pp. L304-L396.

K. Hensen, et al. Darstellung Von N-BZW. O-Chlormethylsitly-l-Derivaten der Armine 1,2,3,4-Tetrahydro-1, 10-Phenanthrolin und 8-Hydroxychinolin, J. of Organometallic Chemistry, 209, 1981, pp. 17-23.

J. Kido, et al. Organic Electroluminescent Devices Using Lanthanide Complexes; Department of Materials Science and Engineering, 1995, Yamagata University, Yamagata Japan, pp. 110-111, source not given.

C.J. Kepert, et al., Structural Systematics of Rare Earth Complexes; V+ The Hydrated 1:1 Adducts of 2,2':6'2"-Terpyrid with Lanthanoid (III) Chlorides, Austr Journal of Chemistry, 1994,, 47, pp. 365-384.

K. Machida, et al., Redox Behavior and Luminescence Property of Europium Polymer Complexes, Department of Applied Chemistry, Faculty of Engineering, Osaka University, Osaka, Japan 1991, pp. 70-71, source not given.

K. Hayashi, et al., Syntheses and Structural Studies of Lanthanide Mixed Ligand Complexes containing B-diketone, Department of Chemistry, Faculty of Science, Ochanomizu University, Tokyo, Japan, 1996, pp. 210-211, source not given.

K. Tsuchiya, et al., Complex Formation of Its High Dispersion in the Simultaneous Vacuum Deposition of Copper and Phthalocyanine, Faculty of Engineering, Yamagata University, Yonezawa, Japan, 1998, pp. 149-154, source not given.

L. K. Templeton, et al., Anomalous Scattering by Praseodymium, Samarium and Gadolinium and Structures of their Ethylenediaminetetraacetate (edta) Salts, Acta. Cyst. (1982), B38, pp. 2155-2159.

J. Kido, et al., Bright red light-emitting organic electroluminescent devices having a europium complex as an emitter, Applied Physics Letters, 65 (17), Oct. 1994, pp. 2124-2126.

T. Wakimoto, et al., Organic EL cells with high luminous efficiency, Applied Science 113/114 (1997) pp. 698-704.

J. Kido, et al., Electroluminescence in a Terbium Complex, Chemistry Letters, The Chemistry Society of Japan, 1990, pp. 657-660.

J. Kido, et al., Multilayer White Light-Emitting Organic Electroluminescent Device, Science, vol. 267, Mar. 1995, pp. 1332-1334.

H. Spreitzer, et al., Soluble Phenyl-Substituted PPVs-New Materials for Highly Efficient Polymer LEDs, Advanced Materials, 10 (1998), No. 16, pp. 1340-1343.

C. C. Wu, et al., Poly(p-phenylene vinylene)/tris(8-hydroxy) quinoline aluminum heterostructure light emitting diode, 320 Applied Physics Letters 66 (Feb. 1995), No. 6, Woodbury, NY, US, pp. 653-655.

W. Hu et al., Red Electroluminescence from an Organic Europium Complex with a Triphenylphosphine Oxide Ligand, Jpn. J. Appl. Phys., vol. 39, Nov. 2000, pp. 6445-6448.

A. MacDiarmid, et al., Polyanilines: A Novel Class of Conducting Polymers, Farady Discussions, Chem. Soc. 88 1989, pp. 317-331.

* cited by examiner m= 0,1,2 etc.
n= 0,1,2 etc.

n = 0,1,2 etc.

m= 0,1,2 etc.
m= 0,1,2 etc.

EDTA

DCTA

DTPA

TTHA

Alq

Bebq

BAlq1

ZnPBO

ZnPBT

DTVb1 or

α-NPB

TPD mTADATA

Example 3a

Example 3b

Example 3b

Example 3c

Example 3c

Example 4a

Example 4a

ELECTROLUMINESCENT DEVICES INCORPORATING MIXED METAL ORGANIC COMPLEXES

The present invention relates to electroluminescent devices incorporating mixed metal complexes of transition metals and other metals.

Materials which emit light when an electric current is passed through them are well known and used in a wide range of display applications. Liquid crystal devices and devices which are based on inorganic semiconductor systems are widely used, however these suffer from the disadvantages of high energy consumption, high cost of manufacture, low quantum efficiency and the inability to make flat panel displays.

Organic polymers have been proposed as useful in electroluminescent devices, but it is not possible to obtain pure colours, they are expensive to make and have a relatively low efficiency.

Another compound which has been proposed is aluminium quinolate, but this requires dopants to be used to obtain a range of colours and has a relatively low efficiency.

Patent application WO98/58037 describes a range of lanthanide complexes which can be used in electroluminescent devices which have improved properties and give better results. Patent Applications PCT/GB98/01773, PCT/GB99/03619, PCT/GB99/04030, PCT/GB99/04024, PCT/GB99/04028, PCT/GB00/00268 describe electroluminescent complexes, structures and devices using rare earth chelates.

Hitherto electroluminescent metal complexes have been based on a rare earth, transition metal, lanthanide or an actinide or have been quinolates such as aluminium quinolate.

We have now invented new electroluminescent metal complexes which include a rare earth, transition metal, lanthanide or an actinide and a non rare earth, transition metal, lanthanide or an actinide.

According to the invention there is provided an electroluminescent device which incorporates a layer of an electroluminescent complex of general formula $(_{\alpha\alpha\alpha})_n M_1 M_2$ where $M_1$ is a rare earth, transition metal, lanthanide or an actinide, $M_2$ is a non rare earth metal, $L_\alpha$ is an organic complex and n is the combined valence state of $M_1$ and $M_2$.

Figure 1:
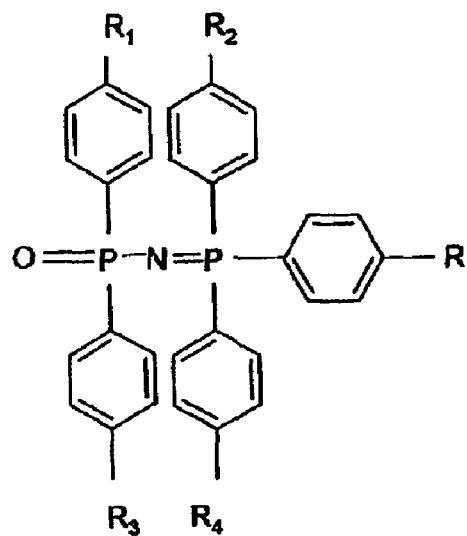
FIGS. 1–9 show exemplary ligands $L_\alpha$ and Lp as described in this application.

Preferably the complex can also comprise one or more neutral ligands $L_p$ so the complex has the general formula $(L_\alpha)_n M_1 M_2 (L_p)$, where $L_p$ is a neutral ligand.

There can be more than one group $L_\alpha$ and more than one group $L_p$ and each of which group may be the same or different.

$M_1$ can be any metal ion having an unfilled inner shell which can be used as the metal and the preferred metals are selected from Sm(III), Eu(II), Eu(III), Tb(III), Dy(III), Yb(III), Lu(III), Gd (III), U(III), U(VI)$O_2$, Tm(III), Th(IV), Ce (III), Ce(IV), Pr(III), Nd(III), Pm(III), Dy(III), Ho(III), Er(III).

The metal $M_2$ can be any metal which is not a rare earth, lanthanide or an actinide examples of metals which can be used include lithium, sodium, potassium, rubidium, caesium, beryllium, magnesium, calcium, strontium, barium, copper, silver, gold, zinc, cadmium, boron, aluminium, gallium, indium, germanium, tin, antimony, lead, and metals of the first, second and third groups of transition metals e.g. manganese, iron, ruthenium, osmium, cobalt, nickel, palladium, platinum, cadmium, chromium, titanium, vanadium, zirconium, tantulum, molybdenum, rhodium, iridium, niobium, scandium, yttrium etc.

The different groups $(L_\alpha)$ may be the same or different and can be selected from β diketones such as those of formulae

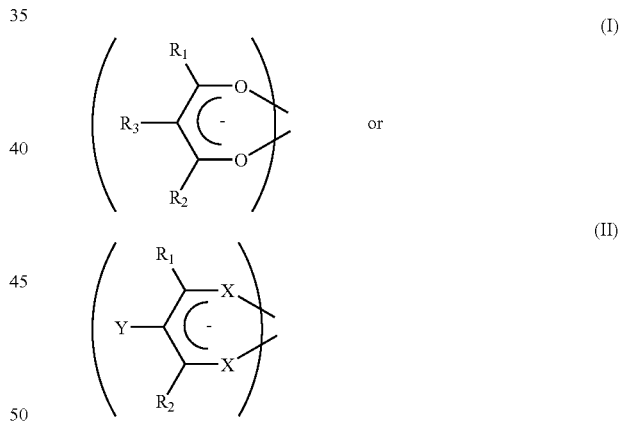

where $R_1$, $R_2$ and $R_3$ can be the same or different and are selected from hydrogen, hydrocarbyl groups, substituted and unsubstituted aliphatic groups substituted and unsubstituted aromatic, heterocyclic and polycyclic ring structures, fluorocarbons such as trifluoryl methyl groups, halogens such as fluorine or thiophenyl groups; $R_1$, $R_2$ and $R_3$ can also be copolymerisable with a monomer e.g. styrene and where X is Se, S or O and Y is hydrogen, hydrocarbyl groups, substituted and unsubstituted aromatic, heterocyclic and polycyclic ring structures, fluorine, fluorocarbons such as trifluoryl methyl groups, halogens such as fluorine or thiophenyl groups or nitrile.

Examples of $R_1$ and/or $R_2$ and/or $R_3$ include aliphatic, aromatic and heterocyclic alkoxy, aryloxy and carboxy groups, substituted and substituted phenyl, fluorophenyl, biphenyl, phenanthrene, anthacene, naphthyl and fluorene groups alkyl groups such as t-butyl, heterocyclic groups such as carbazole $R_1$, $R_2$ and $R_3$ can also be

where X is O, S, Se or NH.

A preferred moiety $R_1$ is trifluoromethyl $CF_3$ and examples of such diketones are, banzoyltrifluoroacetone, p-chlorobenzoyltrifluoroacetone, p-bromotrifluoroacetore, p-phenyltriuoroacetone, 1-naphthoyltrifluoroacetone, 2-naphthoyltrifluoroacetone, 2-phenathoyltrifluoroacetone, 3-phenanthoyltrifluoroacetone, 9-anthroyltrifluoroacetonetrifluoroacetone, cinnamoyltrifluoroacetone, and 2-thenoyltrifluoroacetone.

The different groups ($L_\alpha$) may be the same or different ligands of formulae

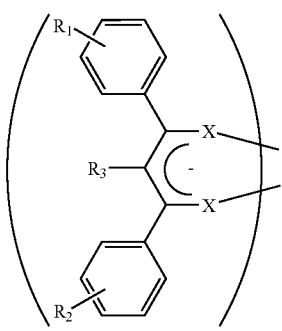
(III)

where X is O,S; or Se and $R_1 R_2$ and $R_3$ are as above

The different groups ($L_\alpha$) may be the same or different quinolate derivatives such as

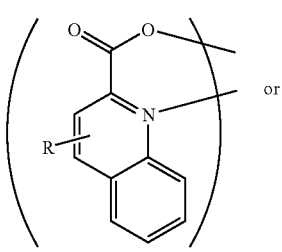
(IV)

or

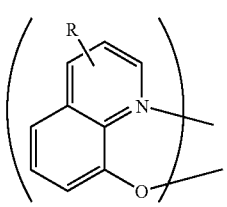
(V)

where R is hydrocarbyl, aliphatic, aromatic or heterocyclic carboxy, aryloxy, hydroxy or alkoxy e.g. the 8 hydroxy quinolate derivatives or

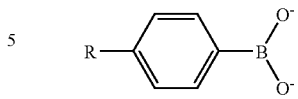
(VII)

where R is as above or H or F or

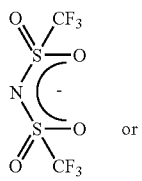
(VIII)

or

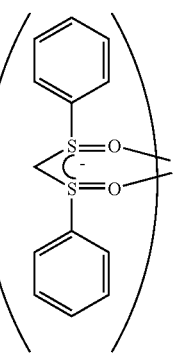
(XIX)

The different groups ($L_\alpha$) may also be the same or different carboxylate groups

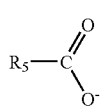
(X)

where $R_5$ is a substituted or unsubstituted aromatic, polycyclic or heterocyclic ring a polypyridyl group, $R_5$ can also be a 2-ethyl hexyl group so $L_\alpha$ is 2-ethylhexanoate or $R_5$ can be a chair structure so that $L_\alpha$ is 2-acetyl cyclohexanoate or L can be

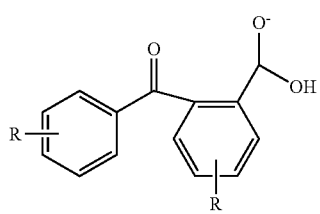
(XI)

where $R_1$ and $R_2$ are as above e.g. alkyl, allenyl, amino or a fused ring such as a cyclic or polycyclic ring.

The different groups ($L_\alpha$) may also be

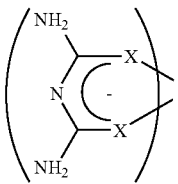
(XII)

or

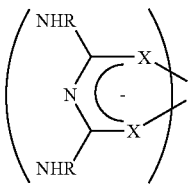
(XIII)

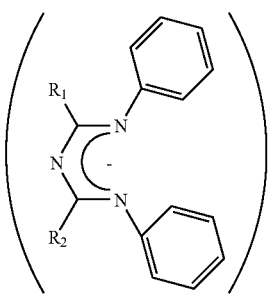
(XIV)

or

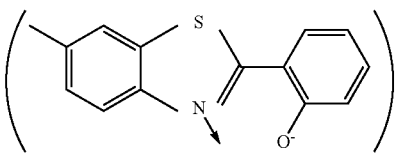
(XV)

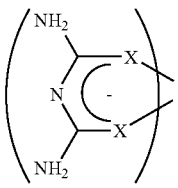
(XVI)

or

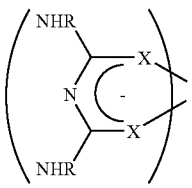
(XVII)

Where $R_1$ and $R_2$ are as above.
The groups $L_p$ can be selected from

Figure 2A:
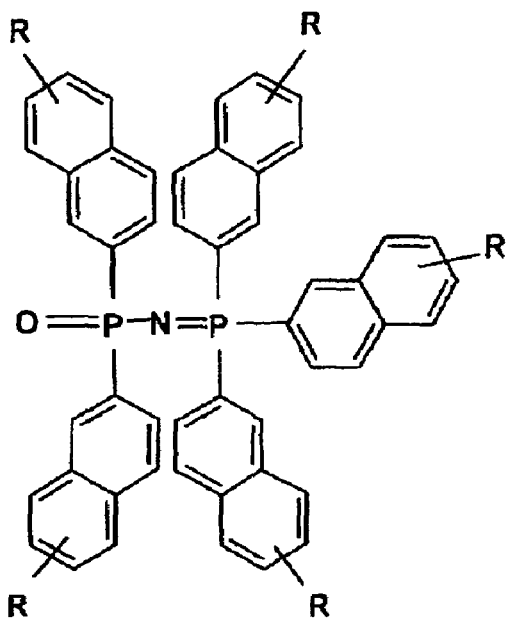
Figure 2B:
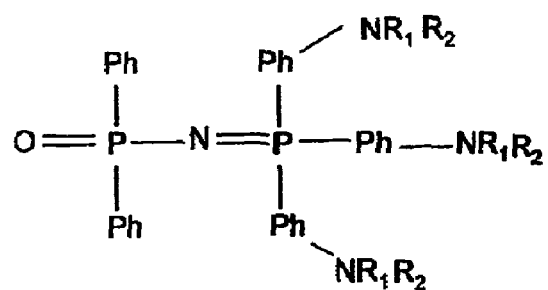

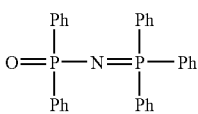
(XVIII)

where each Ph which can be the same or different and can be a phenyl (OPNP) or a substituted phenyl group, other substituted or unsubstituted aromatic group, a substituted or unsubstituted heterocyclic or polycyclic group, a substituted or unsubstituted fused aromatic group such as a naphthyl, anthracene, phenanthrene, perylene or pyrene group. The substituents can be for example an alkyl, aralkyl, alkoxy, aromatic, heterocyclic, polycyclic group, halogen such as fluorine, cyano, amino and substituted amino groups etc. Examples are given in FIGS. 1 and 2 of the drawings where R, $R_1$, $R_2$, $R_3$ and $R_4$ can be the same or different and are selected from hydrogen, hydrocarbyl groups, substituted and unsubstituted aromatic, heterocyclic and polycyclic ring structures, fluorocarbons such as trifluoryl methyl groups, halogens such as fluorine or thiophenyl groups; R, $R_1$, $R_2$, $R_3$ and $R_4$ can also form substituted and unsubstituted fused aromatic, heterocyclic and polycyclic ring structures and can be copolymerisable with a monomer e.g. styrene. R, $R_1$, $R_2$, $R_3$ and $R_4$ can also be unsaturated alkylene groups such as vinyl groups or groups

—C—CH$_2$=CH$_2$—R where R is as above.

$L_p$ can also be compounds of formulae

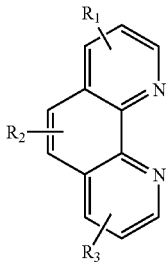
(XIX)

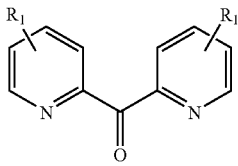
(XX)

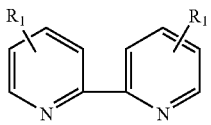
(XXI)

Figure 3:
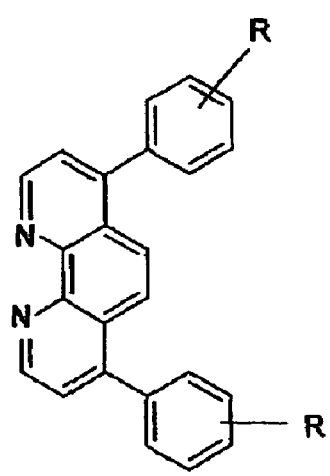
Figure 4A:
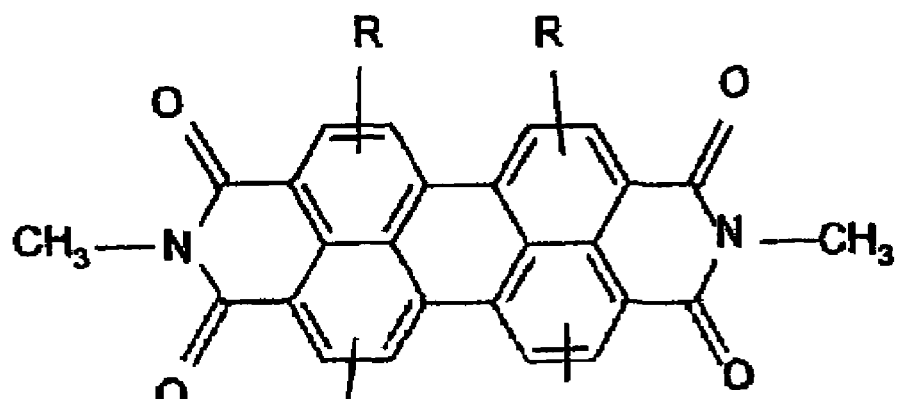
Figure 4B:
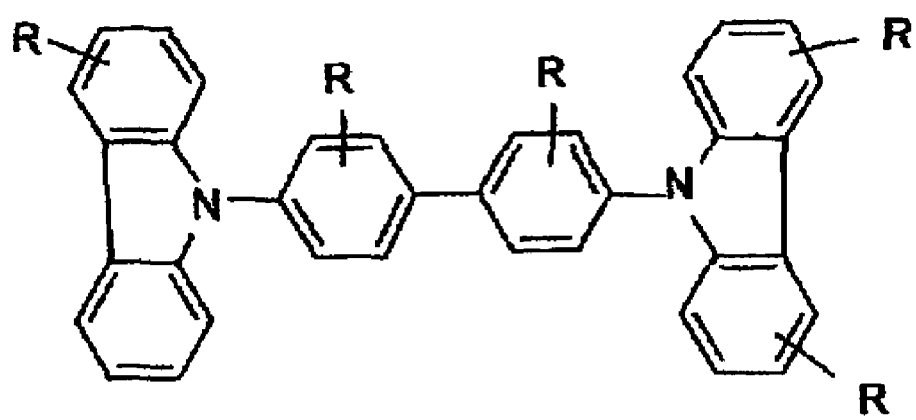
Figure 4C:
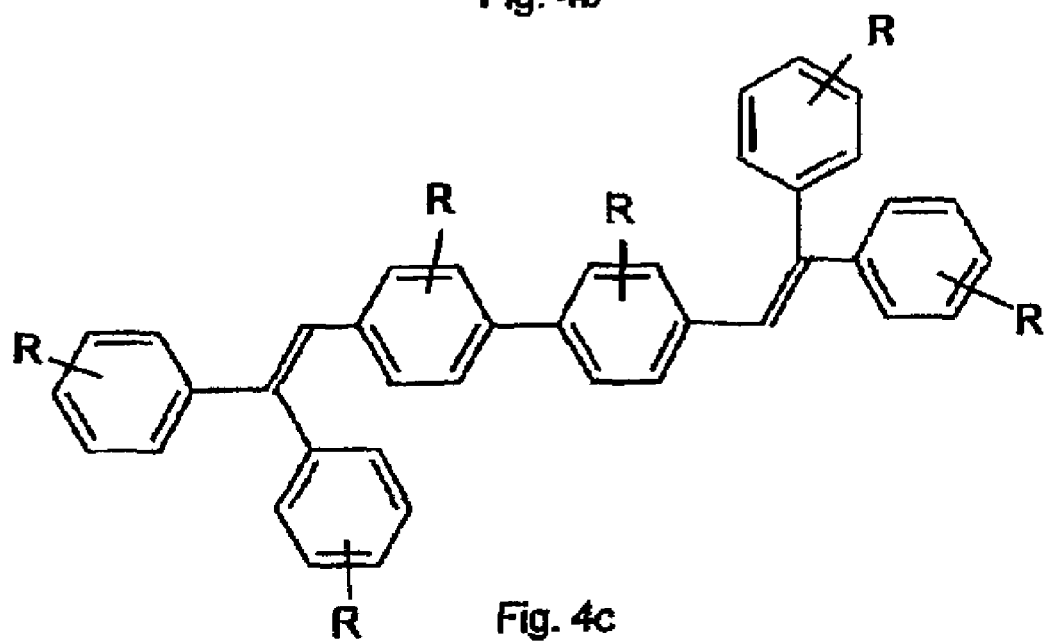
Figure 4D:
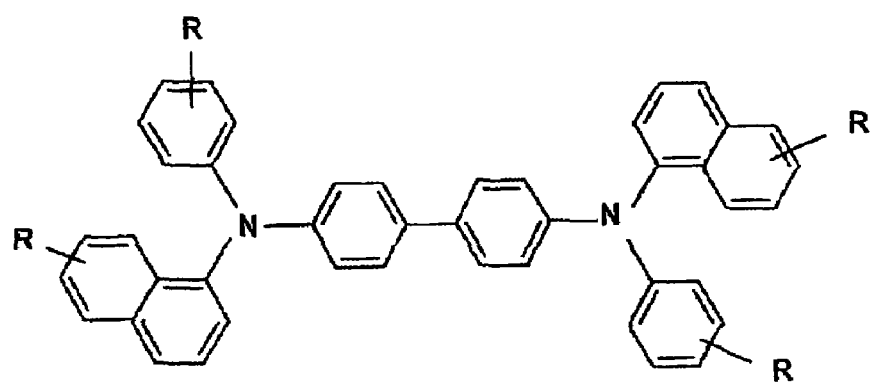
Figure 4E:
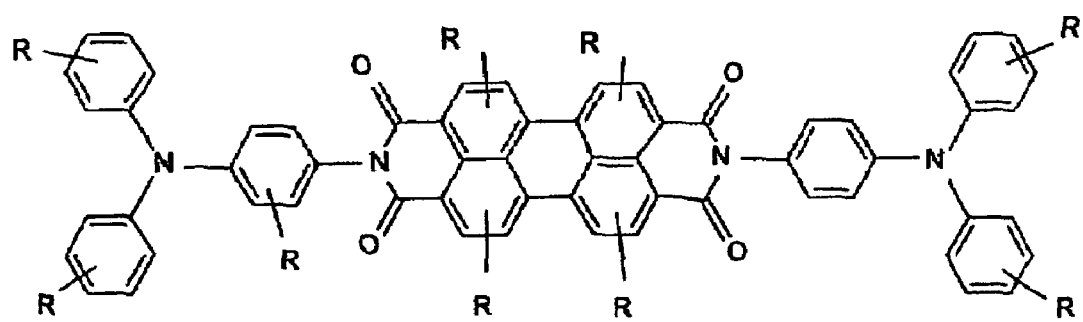
Figure 4F:
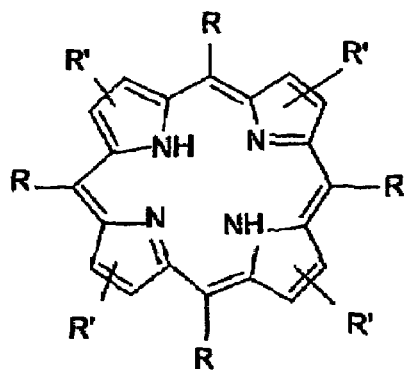
Figure 4G:
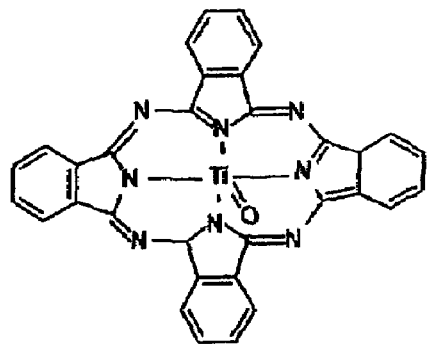
Figure 4H:
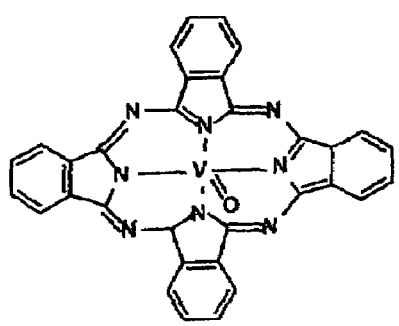
Figure 4I:
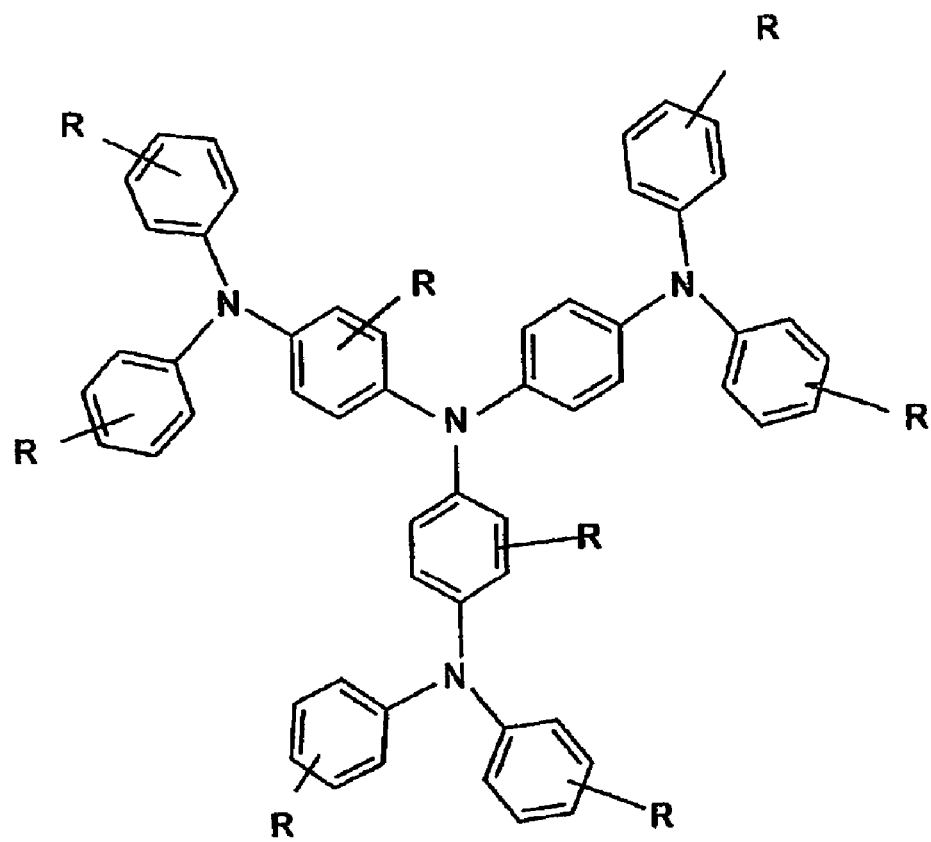
Figure 4J:
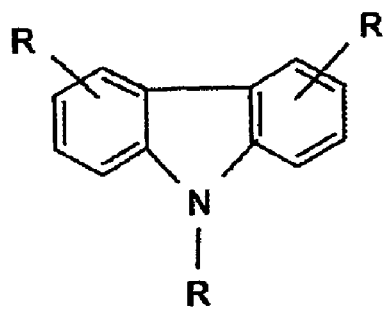
Figure 4K:
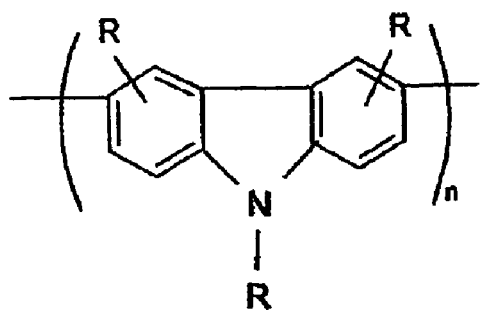
Figure 4L:
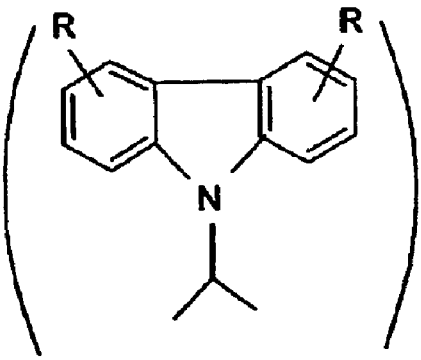
Figure 5A:
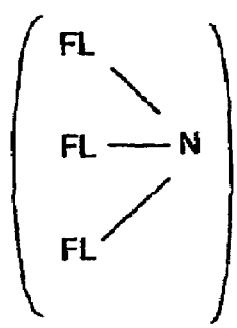
Figure 5B:
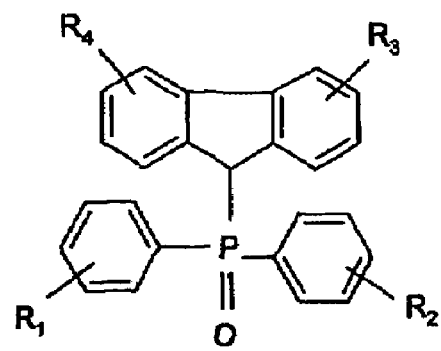
Figure 5C:
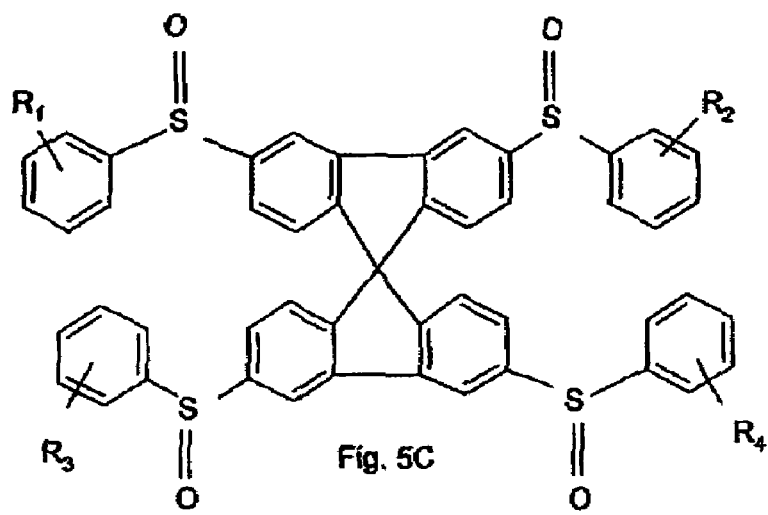
Figure 5D:
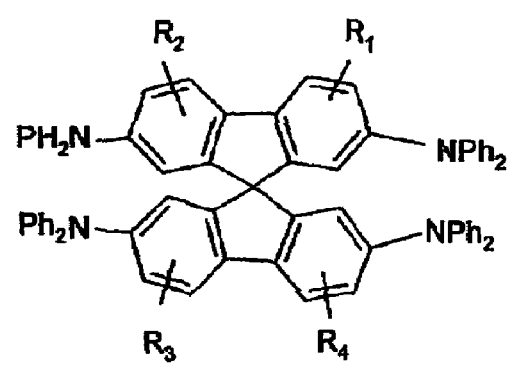
Figure 5F:
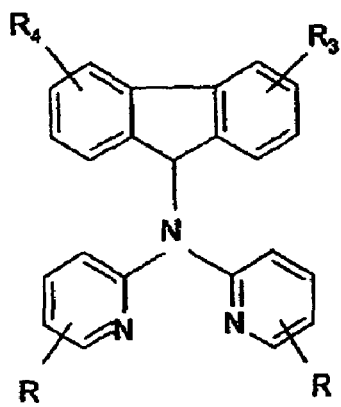
Figure 5G:
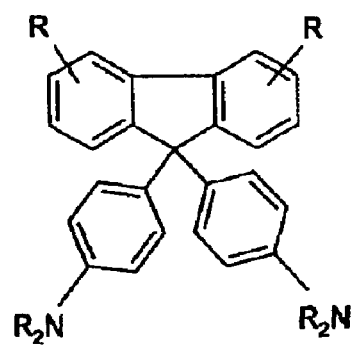
Figure 6A:
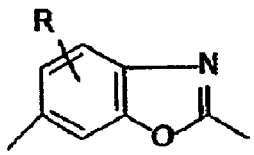
Figure 6B:
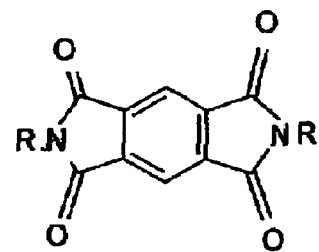
Figure 6C:
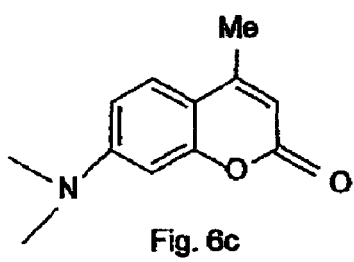
Figure 6D:
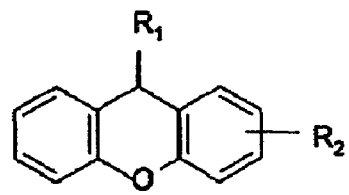
Figure 6E:
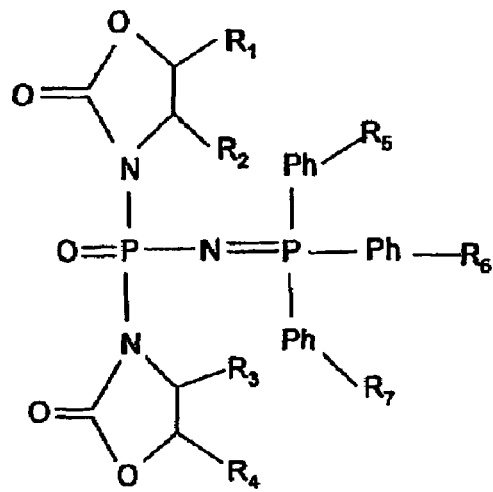
Figure 7A:
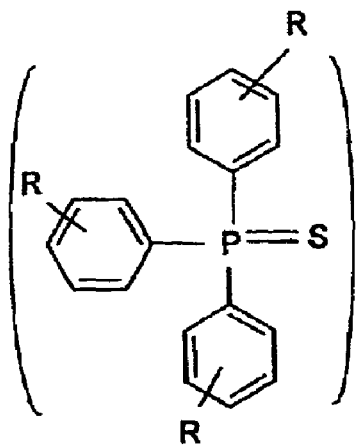
Figure 7B:
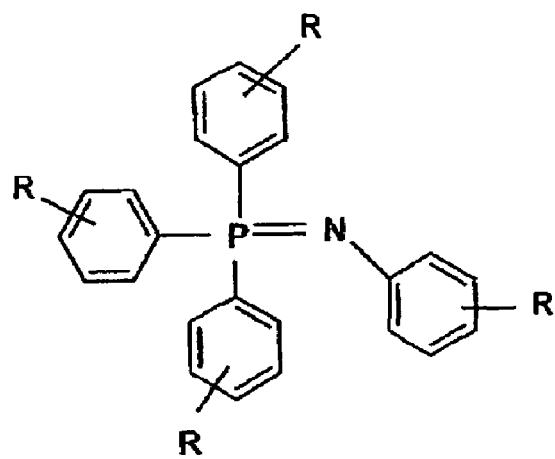
Figure 7C:
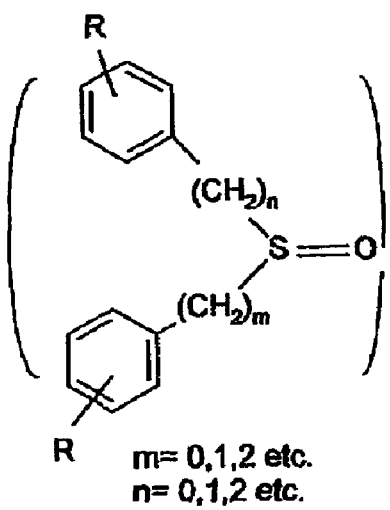
Figure 7D:
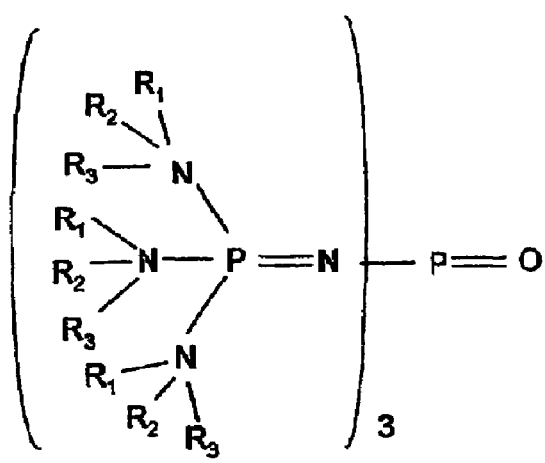
Figure 7E:
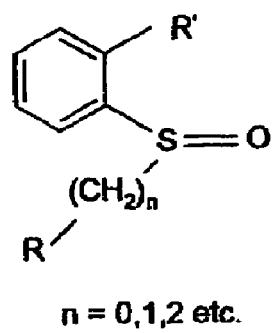
Figure 7F:
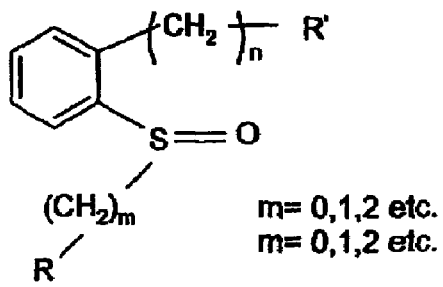
Figure 8A:
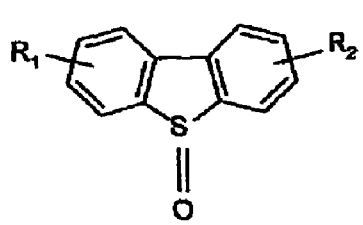
Figure 8B:
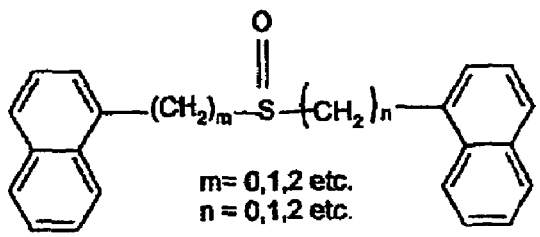
Figure 8C:
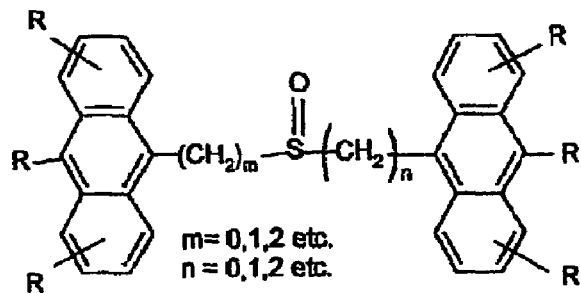
Figure 8D:
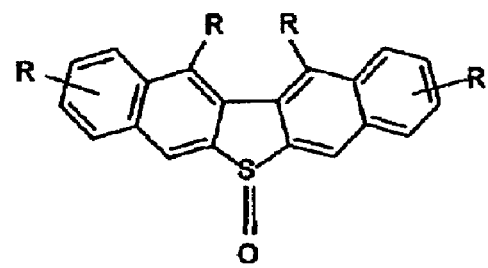
Figure 8E:
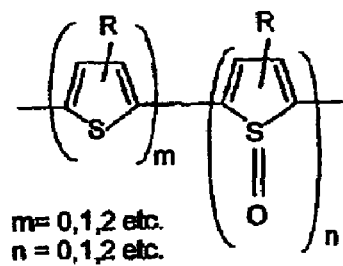
Figure 8F:
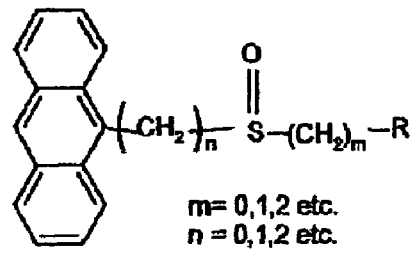
Figure 8G:
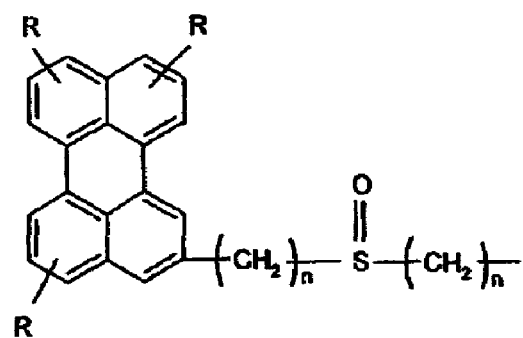
Figure 8G:
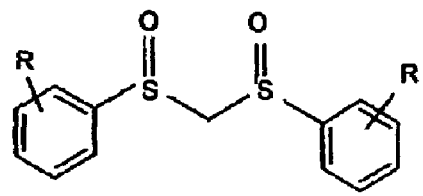

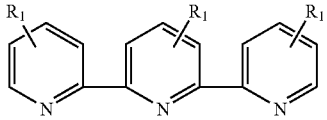
(XXII)

where $R_1$, $R_2$ and $R_3$ are as referred to above, for example bathophen shown in FIG. 3 of the drawings in which R is as above.

$L_p$ can also be

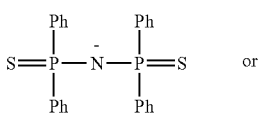
(XXIII)

or

-continued

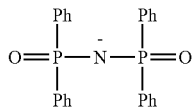
(XXIV)

where Ph is as above.

Other examples of $L_p$ are as shown in FIGS. 4 to 8

Figure 9:
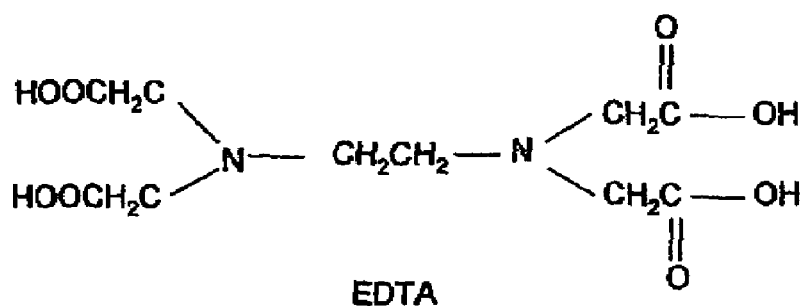
Figure 9:
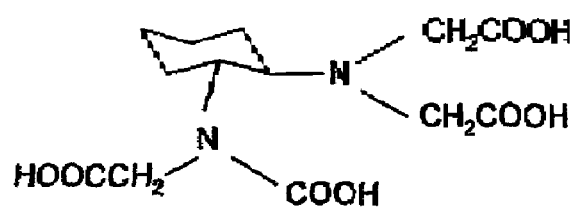
Figure 9:
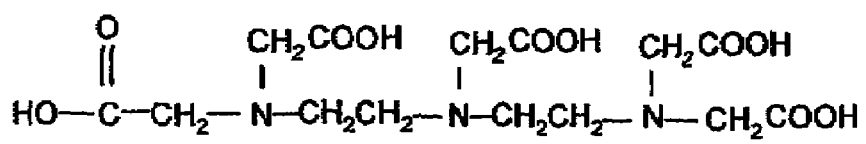
Figure 9:
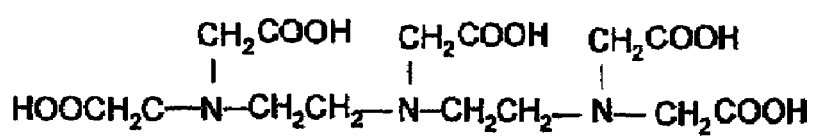

Specific examples of $L_\alpha$ and $L_p$ are tripyridyl and TUMH, and TMHD complexes, α, α', α" tripyridyl, crown ethers, cyclans, cryptans phthalocyanans, porphoiyins ethylene diamine tetramine (EDTA), DCTA, DTPA and TIHA. Where TMHD is 2,2,6,6-tetramethyl-3,5-heptanedionato and OPNP is diphenylphosphonimide triphenyl phosphorane. The formulae of the polyamines are shown in FIG. 9.

The first electrode is preferably a transparent substrate which is a conductive glass or plastic material which acts as the anode, preferred substrates are conductive glasses such as indium tin oxide coated glass, but any glass which is conductive or has a conductive layer can be used. Conductive polymers and conductive polymer coated glass or plastics materials can also be used as the substrate.

The electroluminescent material can be deposited on the substrate directly by evaporation from a solution of the material in an organic solvent. The solvent which is used will depend on the material but chlorinated hydrocarbons such as dichloromethane, n-methyl pyrrolidone, dimethyl sulphoxide, tetra hydrofiran dimethylformamide etc. are suitable in many cases.

Alternatively the material can be deposited by spin coating from solution or by vacuum deposition from the solid state e.g. by sputtering or any other conventional method can be used.

The mixed complexes can be made by reacting a mixture of salts of the metals with the organic complexes as in conventional methods of making the transition metal complexes.

Examples of complexes of the present invention include Eu(DBM)$_3$OPNP, Tb(tmhd)$_3$OPNP, Eu(Zn(DBM)$_5$OPNP etc.

Figure 10:
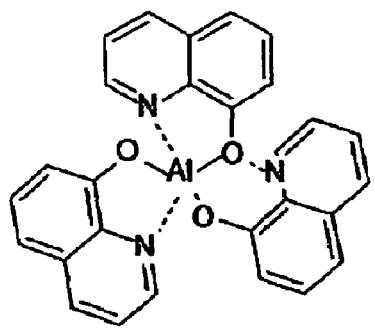
FIGS. 10 and 11 show exemplary quinolates and other electron transmitting materials as described in this application.
Figure 10:
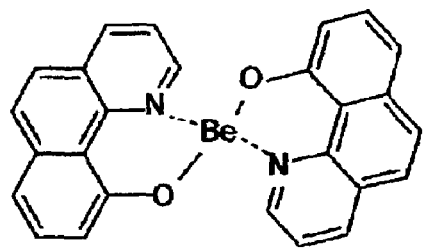
Figure 10:
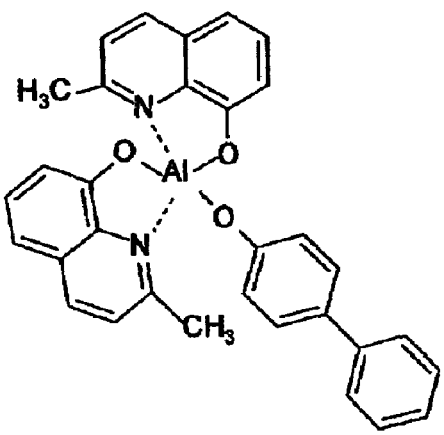
Figure 10:
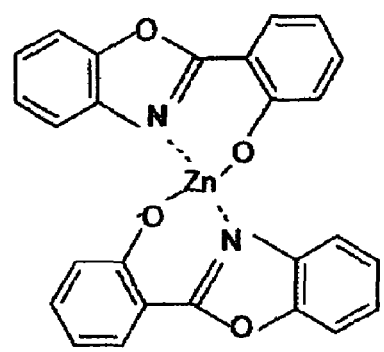
Figure 10:
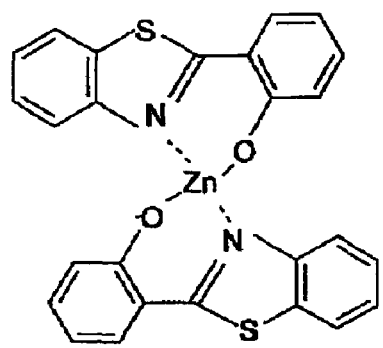
Figure 10:
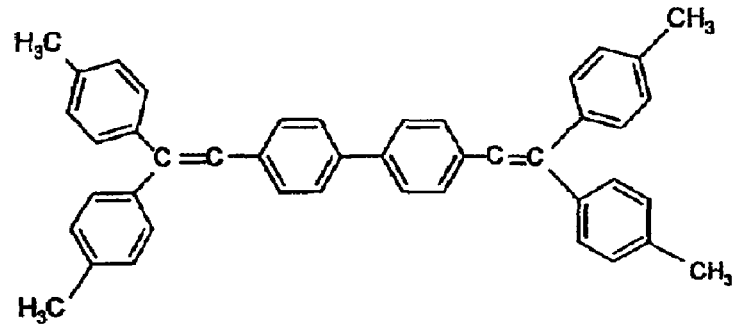
Figure 11:
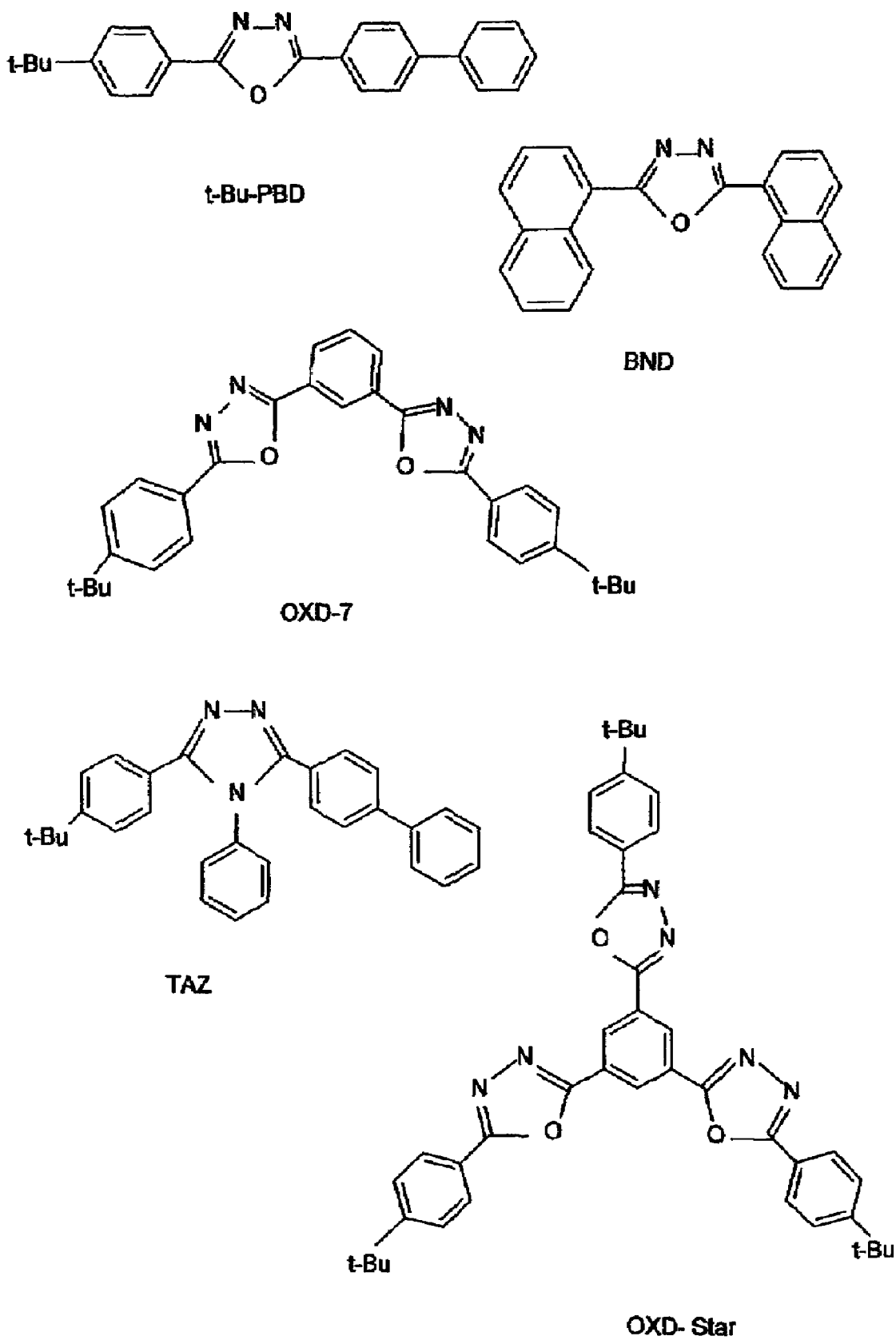
Figure 12A:
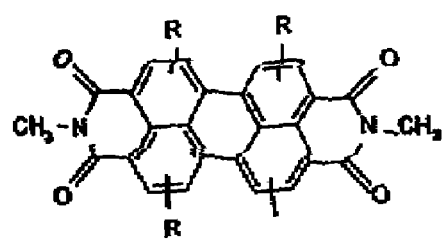
FIGS. 12–16 show exemplary hole transmitting materials as described in this application.
Figure 12B:
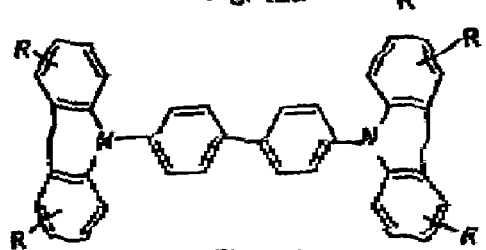
Figure 12C:
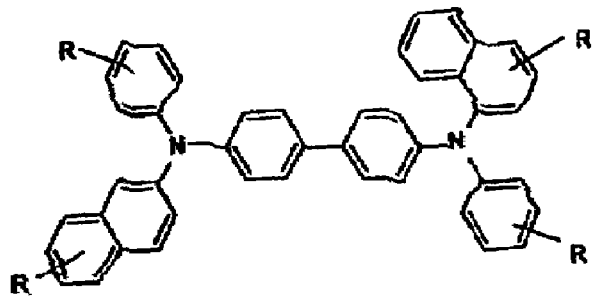
Figure 12D:
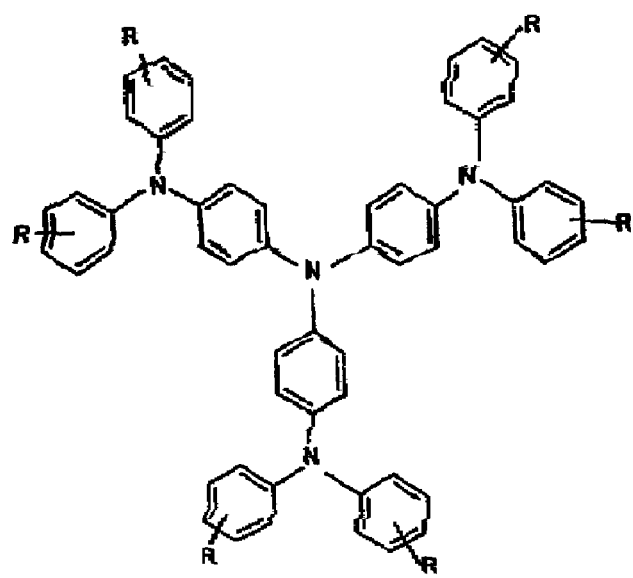
Figure 13A:
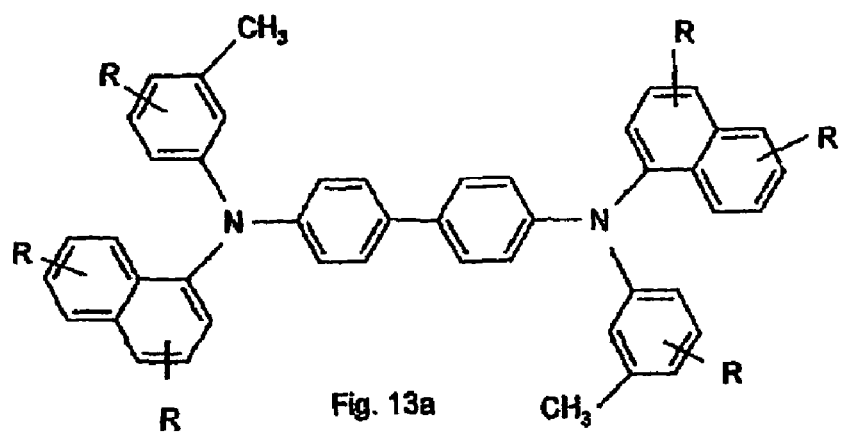
Figure 13B:
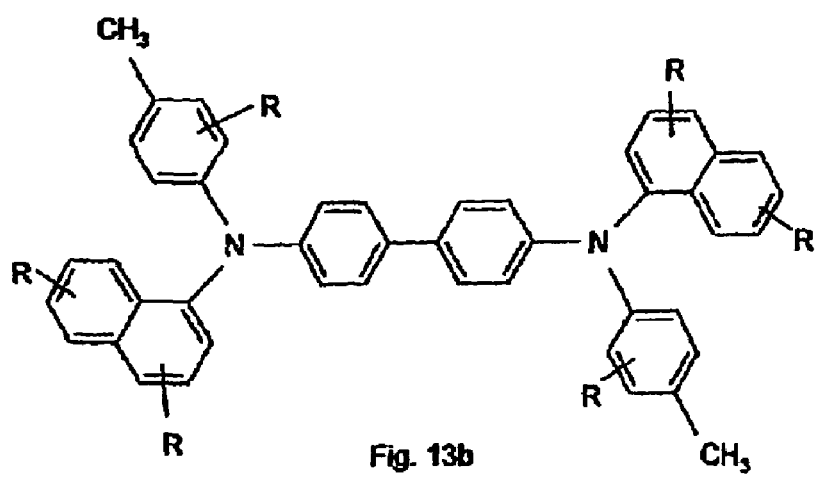
Figure 13C:
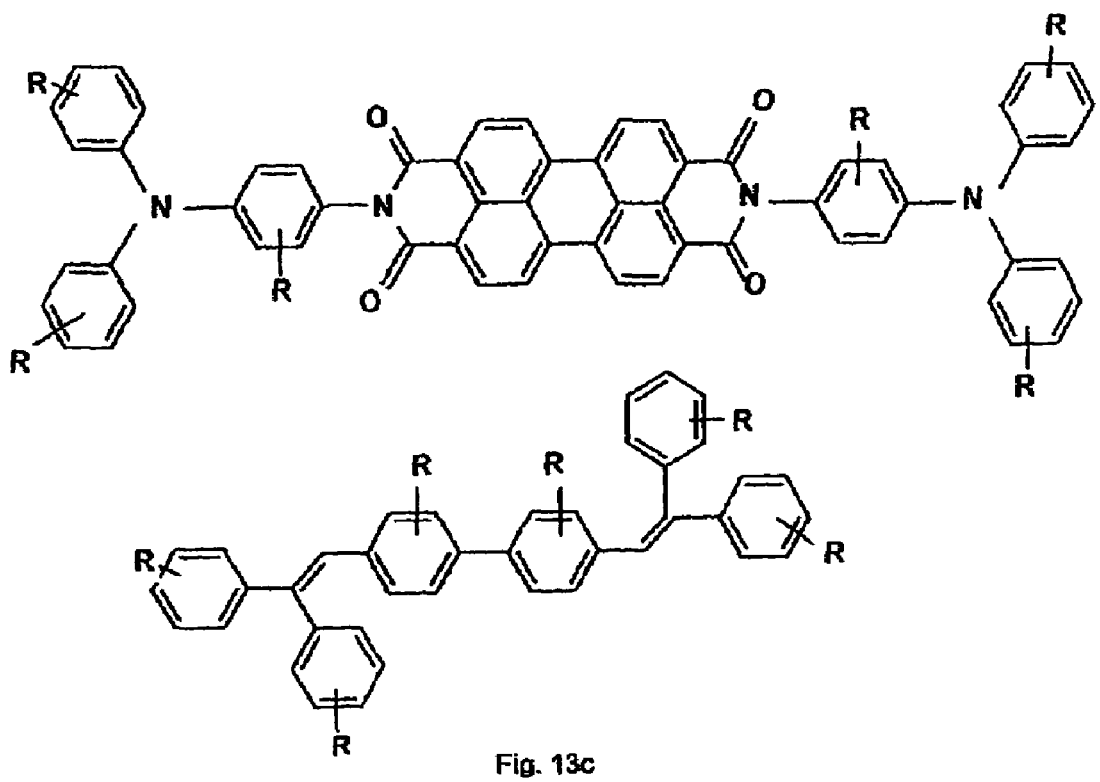
Figure 14A:
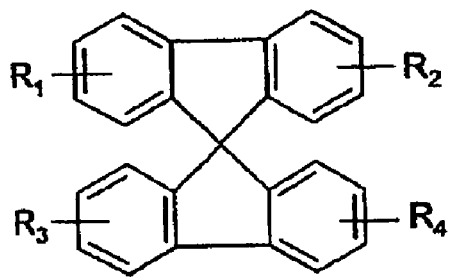
Figure 14B:
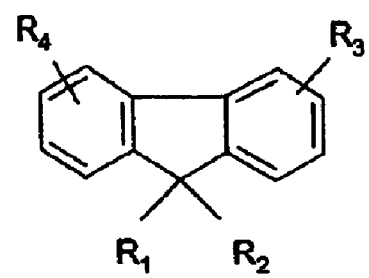
Figure 14C:
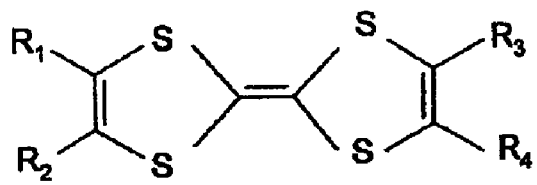
Figure 14C:
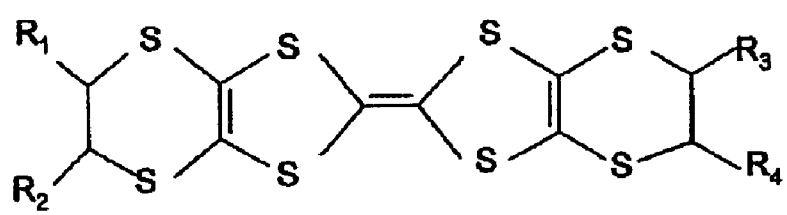
Figure 14D:
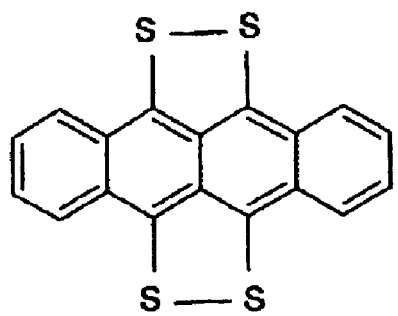
Figure 15A:
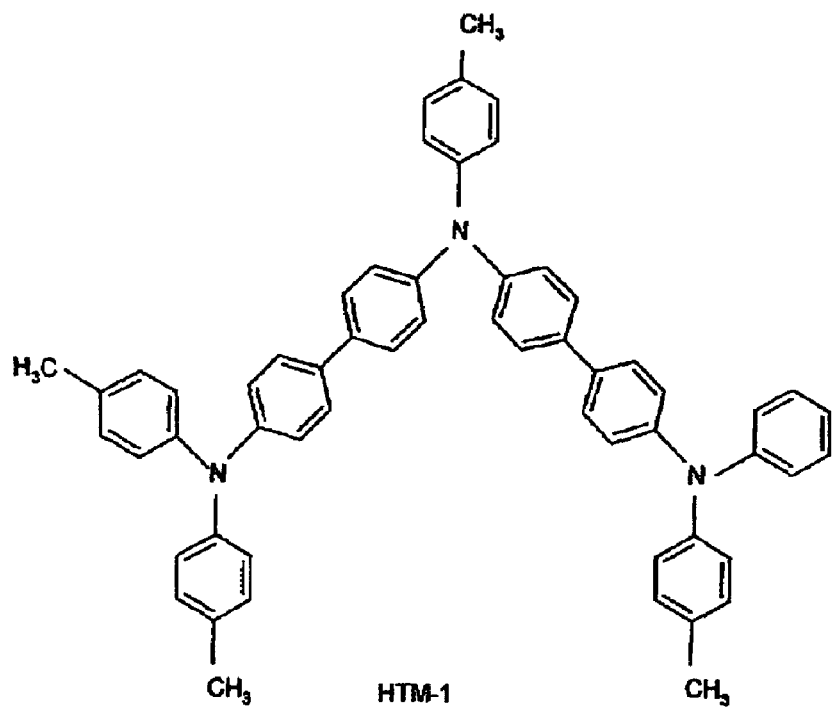
Figure 15B:
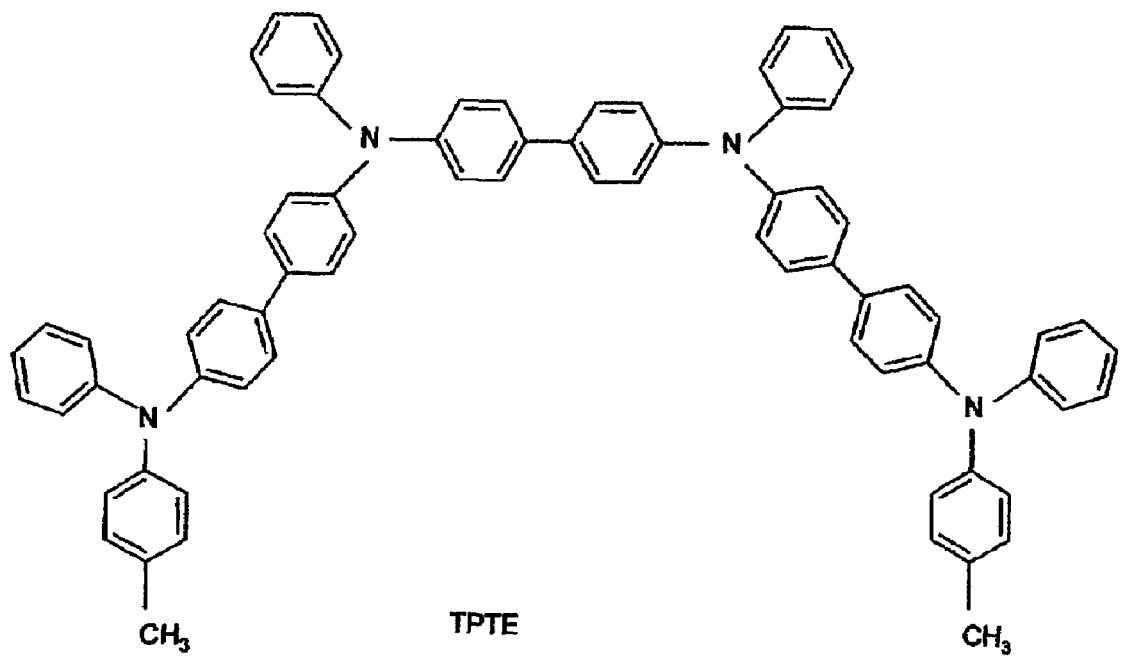
Figure 16A:
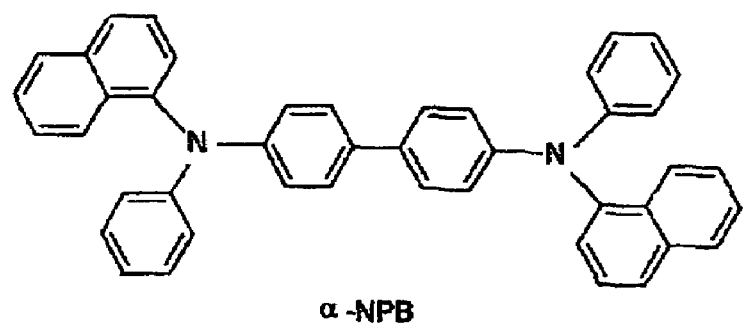
Figure 16B:
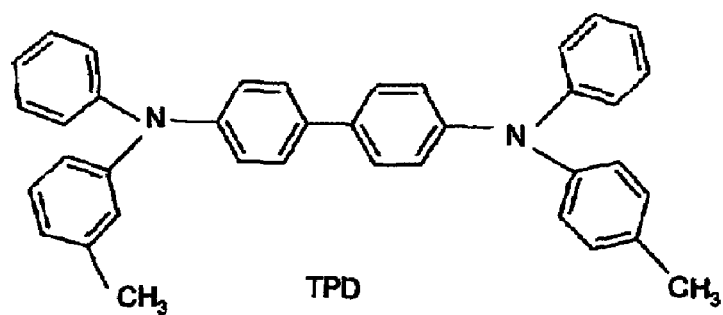
Figure 16C:
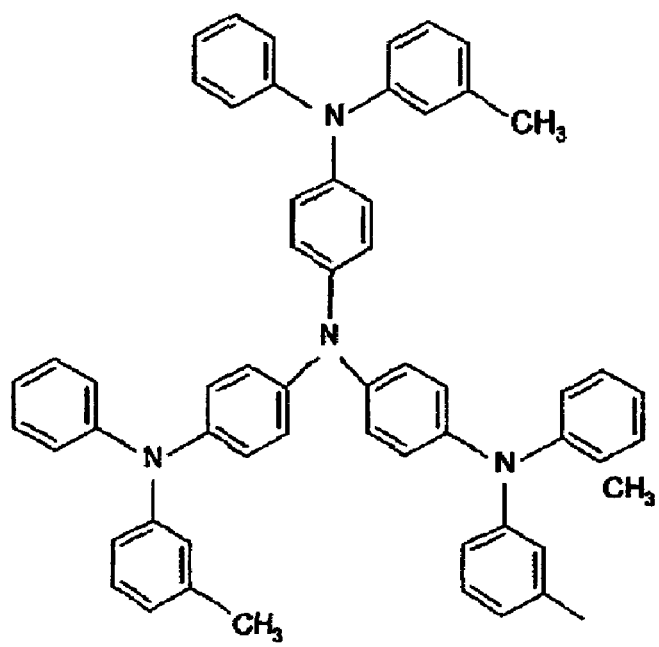

Optionally there is a layer of an electron transmitting material between the cathode and the electroluminescent material layer, the electron transmitting material is a material which will transport electrons when an electric current is passed through electron transmitting materials include a metal complex such as a metal quinolate e.g. an aluminium quinolate, lithium quinolate a cyano anthracene such as 9,10 dicyano anthracene, a polystyrene sulphonate and compounds of formulae shown in FIGS. 10 and 11. Instead of being a separate layer the electron transmitting material can be mixed with the electroluminescent material and co-deposited with it.

In general the thickness of the layers is from 5 nm to 500 nm.

The second electrode functions as the cathode and can be any low work function metal e.g. aluminium, calcium, lithium, silver/magnesium alloys etc., aluminium is a preferred metal. Lithium fluoride can be used as the second electrode for example by having a lithium fluoride layer formed on a metal.

Preferably there is a hole transporting layer deposited on the transparent substrate and the electroluminescent material is deposited on the hole transporting layer. The hole transporting layer serves to transport holes and to block the electrons, thus preventing electrons from moving into the electrode without recombining with holes. The recombination of carriers therefore mainly takes place in the emitter layer.

Hole transporting layers are used in polymer electroluminescent devices and any of the known hole transporting materials in film form can be used.

In general the thickness of the layers is from 5 nm to 500 nm and preferably the thickness of the electroluminescent layer is from 20 to 50 mn.

The second electrode functions as the cathode and can be any low work function metal e.g. aluminium, calcium, lithium, silver/magnesium alloys etc., aluminium is a preferred metal. Lithium fluoride can be used as the second electrode for example by having a lithium fluoride layer formed on a metal.

Preferably there is a hole transporting layer deposited on the transparent substrate and the electroluminescent material is deposited on the hole transporting layer. The hole transporting layer serves to transport holes and to block the electrons, thus preventing electrons from moving into the electrode without recombining with holes. The recombination of carriers therefore mainly takes place in the emitter layer.

Preferably there is a hole transporting layer deposited on the transparent substrate and the electroluminescent material is deposited on the hole transporting layer. The hole transporting layer serves to transport holes and to block the electrons, thus preventing electrons from moving into the electrode without recombining with holes. The recombination of carriers therefore mainly takes place in the emitter layer.

Hole transporting layers are used in polymer electroluminescent devices and any of the known hole transporting materials in film form can be used.

Examples of such hole transporting materials are aromatic amine complexes such as poly (vinylcarbazole),N,N'-diphenyl-N, N'-bis(3-methylphenyl)-1,1'-biphenyl-4,4'-diamine (TPD), an unsubstituted or substituted polymer of an amino substituted aromatic compound, a polyaniline, substituted polyanilines, polythiophenes, substituted polythiophenes, polysilanes etc. Examples of polyanilines are polymers of

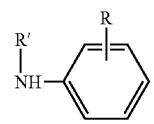
(VIII)

where R is in the ortho—or meta-position and is hydrogen, C1–18 alkyl, C1–6 alkoxy, amino, chloro, bromo, hydroxy or the group

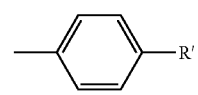

where R is ally or aryl and R' is hydrogen, C1–6 alkyl or aryl with at least one other monomer of formula I above.

Polyanilines which can be used in the present invention have the general formula

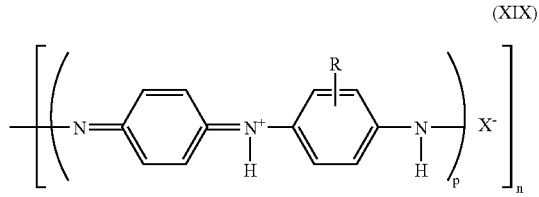

(XIX)

where p is from 1 to 10 and n is from 1 to 20, R is as defined above and X is an anion, preferably selected from Cl, Br, $SO_4$, $BF_4$, $PF_6$, $H_2PO_3$, $H_2PO_4$, arylsulphonate, arenedicarboxylate, polystyrenesulphonate, polyacrylate alkysulphonate, vinylsulphonate, vinylbenzene sulphonate, cellulose sulphonate, camphor sulphonates, cellulose sulphate or a perfluorinated polyanion.

Examples of arylsulphonates are p-toluenesulphonate, benzenesulphonate, 9,10-anthraquinone-sulphonate and anthracenesulphonate, an example of an arenedicarboxylate is phthalate and an example of arenecarboxylate is benzoate.

We have found that protonated polymers of the unsubstituted or substituted polymer of an amino substituted aromatic compound such as a polyaniline are difficult to evaporate or cannot be evaporated, however we have surprisingly found that if the unsubstituted or substituted polymer of an amino substituted aromatic compound is deprotonated the it can be easily evaporated i.e. the polymer is evaporable.

Preferably evaporable deprotonated polymers of unsubstituted or substituted polymer of an amino substituted aromatic compound are used. The de-protonated unsubstituted or substituted polymer of an amino substituted aromatic compound can be formed by deprotonating the polymer by treatment with an alkali such as ammonium hydroxide or an alkali metal hydroxide such as sodium hydroxide or potassium hydroxide.

The degree of protonation can be controlled by forming a protonated polyaniline and de-protonating. Methods of preparing polyanilines are described in the article by A. G. MacDiarmid and A. F. Epstein, Faraday Discussions, Chem Soc. 88 P319 1989.

The conductivity of the polyaniline is dependant on the degree of protonation with the maximum conductivity being when the degree of protonation is between 40 and 60% e.g. about 50% for example.

Preferably the polymer is substantially fully deprotonated

A polyaniline can be formed of octamer units i.e. p is four e.g.

The polyaniline can be a copolymer of aniline and preferred copolymers are the copolymers of aniline with o-anisidine, m-sulphanilic acid or o-aminophenol, or o-toluidine with o-aminophenol, o-ethylamine, o-phenylene diamine or with amino anthracenes.

Other polymers of an amino substituted aromatic compound which can be used include substituted or unsubstituted polyaminonapthalenes, polyaminoanthracenes, polyaminophenanthrenes, etc. and polymers of any other condensed polyaromatic compound. Polyaminoanthracenes and methods of making them are disclosed in U.S. Pat. No. 6,153,726. The aromatic rings can be unsubstituted or substituted e.g. by a group R as defined above.

The polyanilines can be deposited on the first electrode by conventional methods e.g. by vacuum evaporation, spin coating, chemical deposition, direct electrodeposition etc. preferably the thickness of the polyaniline layer is such that the layer is conductive and transparent and can is preferably from 20 nm to 200 nm. The polyanilines can be doped or undoped, when they are doped they can be dissolved in a solvent and deposited as a film, when they are undoped they are solids and can be deposited by vacuum evaporation i.e. by sublimation.

The polymers of an amino substituted aromatic compound such as polyanilines referred to above can also be used as buffer layers with or in conjunction with other hole transporting materials.

The structural formulae of some other hole transporting materials are shown in FIGS. 12 to 16 of the drawings, where $R_1$, $R_2$ and $R_3$ can be the same or different and are selected from hydrogen, and substituted and unsubstituted hydrocarbyl groups such as substituted and unsubstituted aliphatic groups, substituted and unsubstituted aromatic, heterocyclic and polycyclic ring structures, fluorocarbons such as trifluoryl methyl groups, halogens such as fluorine or thiophenyl groups; $R_1$, $R_2$ and $R_3$ can also form substituted and unsubstituted fused aromatic, heterocyclic and polycyclic ring structures and can be copolymerisable with a monomer e.g. styrene. X is Se, S or O, Y can be hydrogen, substituted or unsubstituted hydrocarbyl groups, such as substituted and unsubstituted aromatic, heterocyclic and polycyclic ring structures, fluorine, fluorocarbons such as trifluoryl methyl groups, halogens such as fluorine or thiophenyl groups or nitrile.

Examples of $R_1$ and/or $R_2$ and/or $R_3$ include aliphatic, aromatic and heterocyclic alkoxy, aryloxy and carboxy groups, substituted and substituted phenyl, fluorophenyl,

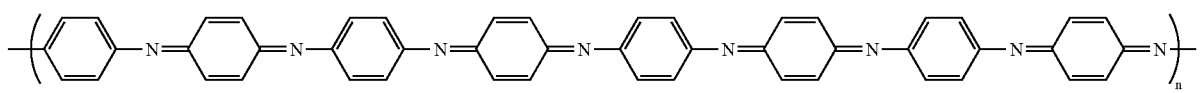

The polyanilines can have conductivities of the order of $1 \times 10^{-1}$ Siemen $cm^{-1}$ or higher.

The aromatic rings can be unsubstituted or substituted e.g. by a C1 to 20 alkyl group such as ethyl.

biphenyl, phenanthrene, anthracene, naphthyl and fluorene groups alkyl groups such as t-butyl, heterocyclic groups such as carbazole.

The preparation of complexes according to the invention are illustrated in the following examples.

EXAMPLE 1

Preparation of EuZn(DBM)$_5$(OPNP)

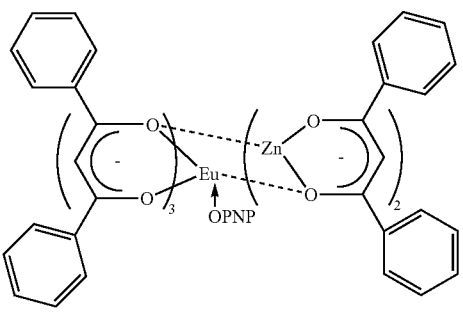

A mixture of dibenzoylmethane (DBM) (4.1 g; 0.0 18 mole) and OPNP (3.5 g; 0.007 mole) was dissolved in ethanol (40 ml) by warming the magnetically stirred solution. A solution containing ZnCl$_2$ (0.5 g; 0.0037 mole) and EuCl$_3$ (1.34 g; 0.0037 mole) in water (10 ml) was added to the reaction mixture, followed by 2N NaOH solution until the pH was 6–7. The precipitate was filtered off, washed with water and ethanol and dried under vacuum at 80° C. for 16 hours. The product had a M.P. of 182° C. Films of the product were obtained by dissolving the product in a solvent and evaporating from the solution.

Elemental analysis: Found C 69.59, H 4.56, N 0.79. C$_{105}$H$_{80}$O$_{11}$NP$_2$EuZn requires C 69.63, H 4.45 and N 0.77. The elemental analysis suggests that there was only one OPNP.

The ultraviolet spectrum was

UV ($\lambda$max) nm (thick evaporated film): 356, 196

UV ($\lambda$max) nm (thin evaporated film): 362

UV ($\lambda$max) nm (thin film made from CH$_2$Cl$_2$ solution): 360, 195

TGA: ° C. (% weight loss): 350(11),444 (39) and 555 (80)

The photoluminescent colour had co-ordinates: x 0.66, y 0.33

EXAMPLE 2

EuAl(DBM)$_6$OPNP

A warm ethanolic solution (50 ml) of dibenzoylmethane (DBM) (3.67 g. 0.016 mole) was mixed with an ethanolic solution (30 ml) of OPNP (2.60 g. 0.005 mole). NaOH (0.65 g, 0.0 16 mole) in water (30 ml) was added to the ligand (DBM) solution while stirring. The solution became dark yellow. The solution was stirred for 10 minutes. After 10 minutes, a mixture of EuCl$_3$.6H$_2$O (1 g 0.0027 mole) in ethanol: water (1:1) (20 ml) and AlCl$_3$.6H$_2$O (0.658 g. 0.0027 mole) in water (20 ml) was slowly added while stirring. The reaction mixture was stirred for 5 hours at 60° C. The yellow colour product was suction filtered and thoroughly washed with water followed by ethanol. Product was vacuum dried at 80° C. Analysis showed it to be EuAL(DBM)$_6$OPNP.

EXAMPLE 3

Electroluminescent Device

Figure 17:
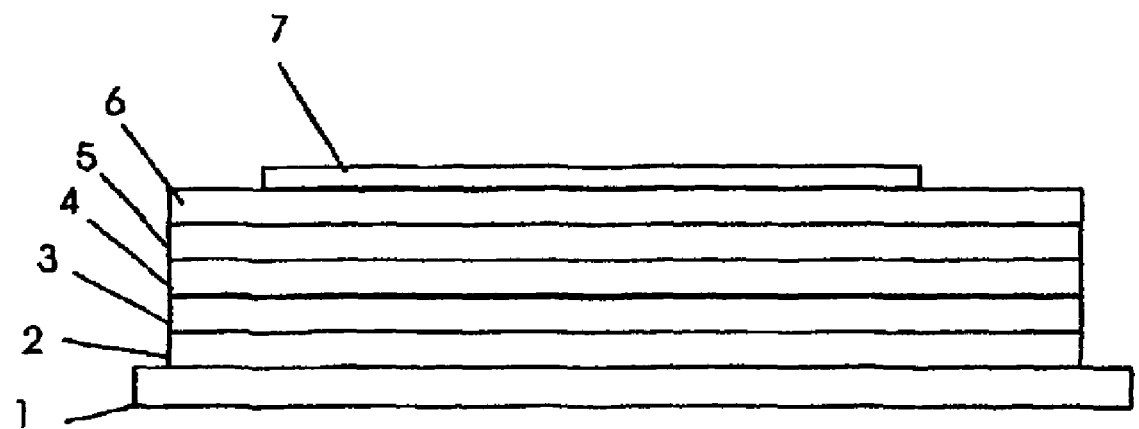
FIG. 17 is a diagrammatic section of an exemplary LED cell as described in this application.

An ITO coated glass piece (1×1 cm$^2$) had a portion etched out with concentrated hydrochloric acid to remove the ITO and was cleaned and dried. The device is shown in FIG. 17 where (1) is ITO; (2) CuPc; (3) α-NPB; (4) EuZn(DBM)$_5$(OPNP); (5) BCP; (6) Alq$_3$; (7) LiF; (8) Al was fabricated by sequentially forming on the ITO, by vacuum evaporation, layers comprising:

ITO(100Ω/sqr)|CuPc (6.6 nm)|α-NPB(35 mm)|EuZn(DBM)$_5$(OPNP)(35 nm)|BCP (8 nm)|Alq$_3$(10 nm)|LiF(3 nm)|Al (500 nm).

Where CuPc is copper phthalocyanine, BCP bathocupron and Alq$_3$ is aluminiumn quinolate.

The EuZn(DBM)$_5$(OPNP) was prepared as in Example 1.

The organic coating on the portion which had been etched with the concentrated hydrochloric acid was wiped with a cotton bud.

The coated electrodes were stored in a vacuum desiccator over a molecular sieve and phosphorous pentoxide until they were loaded into a vacuum coater (Edwards, 10$^{-6}$ torr) and aluminium top contacts made. The active area of the LED's was 0.08 cm by 0.1 cm$^2$ the devices were then kept in a vacuum desiccator until the electroluminescent studies were performed.

The ITO electrode was always connected to the positive terminal. The current vs. voltage studies were carried out on a computer controlled Keithly 2400 source meter.

Figure 18:
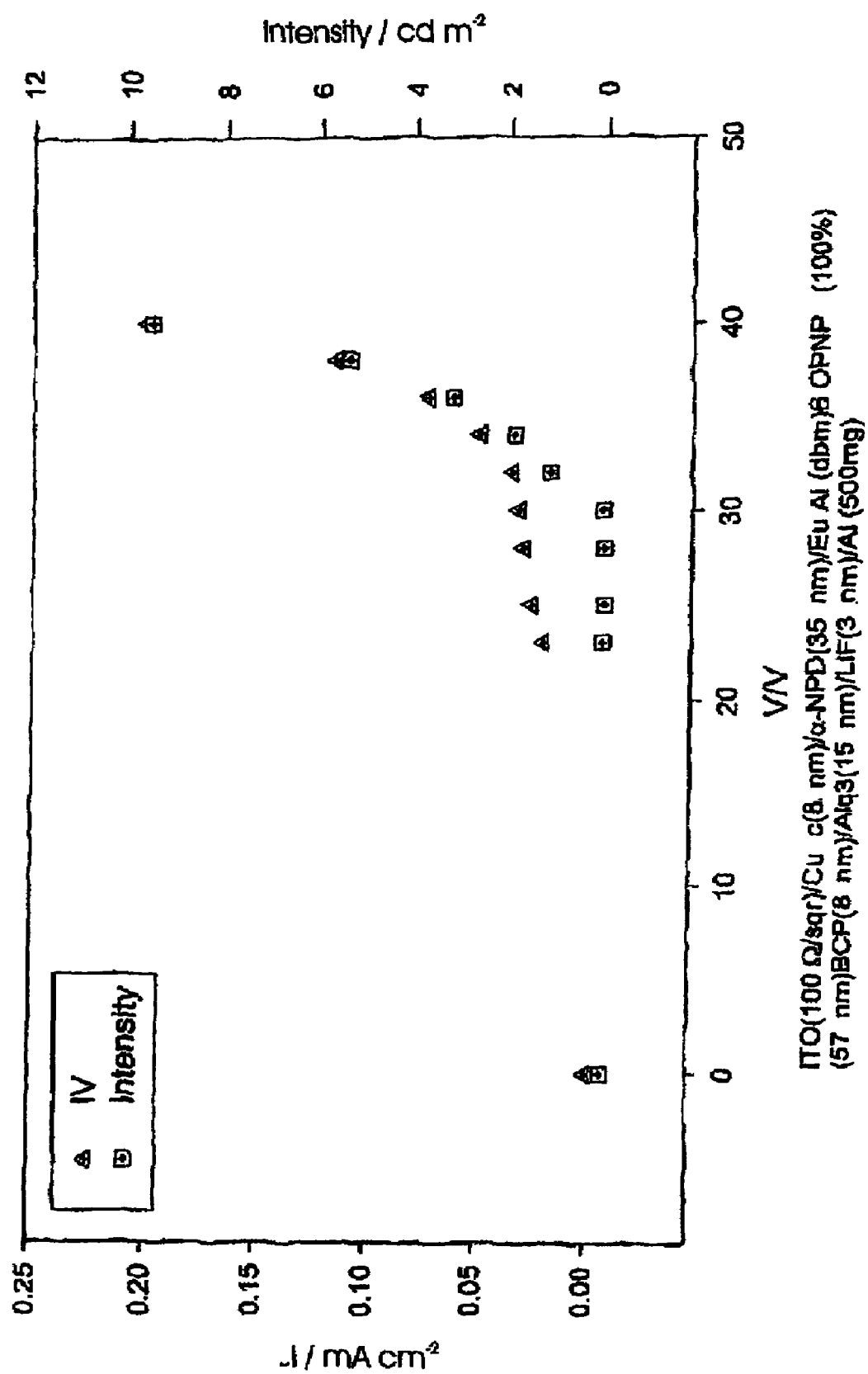
FIG. 18 is a plot of intensity against voltage for the device of Example 2 as described in this application.

An electric current was applied across the device and a plot of the radiance and intensity against voltage is shown in the graph of FIG. 18.

Figure 19:
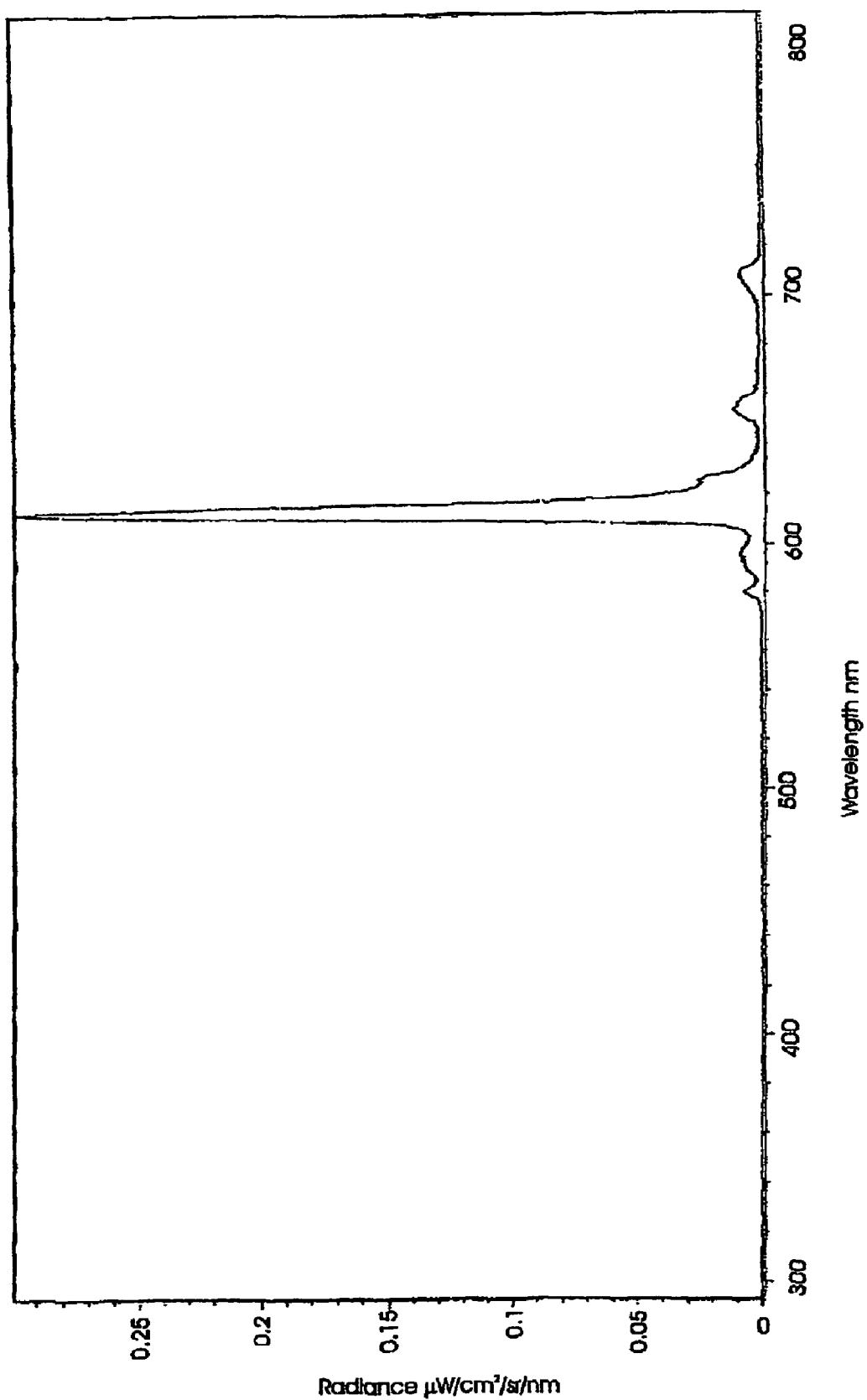
FIG. 19 is a plot of radiance against wavelength for the device of Example 2 as described in this application.

A plot of radiance against wavelength is shown in FIG. 19, and the colour coordinates according to the CIE colour chart were x=0.65857; y=0.33356 which is reddish orange.

EXAMPLE 3a

Other devices were fabricated as above with the structure 100ΩITO and Al electrodes

| Material | CuPc | α-NPB | EuZn(DBM)$_5$(OPNP) | BCP | Alq$_3$ | LiF |
|---|---|---|---|---|---|---|
| Thickness/nm | 1.4 | 6.9 | 36.3 | 4.0 | 11.5 | 0.8 |

The electroluminescent properties were

| Voltage/V | Current/mA | Current Density/mAcm$^{-2}$ | x, y | Brightness/cdm$^{-2}$ | Current Efficiency/cdA$^{-1}$ | Electroluminescent Efficiency/lmW$^{-1}$ |
|---|---|---|---|---|---|---|
| 19.0 | 10.10 | 168.33 | 0.55, 0.42 | 160.60 | 0.10 | 0.02 |

EXAMPLE 3b

Other devices were fabricated as above with the structure 100Ω ITO and Al electrodes

| Material | CuPc | α-NPB | EuZn(DBM)$_5$(OPNP) | BCP | Alq$_3$ | LiF |
|---|---|---|---|---|---|---|
| Thickness/nm | 4.2 | 20.2 | 117.9 | 4.0 | 11.5 | 0.8 |

The electroluminescent properties were

| Voltage/V | Current/mA | Current Density/mAcm$^{-2}$ | x, y | Brightness/cdm$^{-2}$ | Current Efficiency/cdA$^{-}$ | Electroluminescent Efficiency/lmW$^{-1}$ |
|---|---|---|---|---|---|---|
| 22.0 | 1.21 | 20.17 | 0.62, 0.37 | 53.78 | 0.27 | 0.040 |

Figure 23:
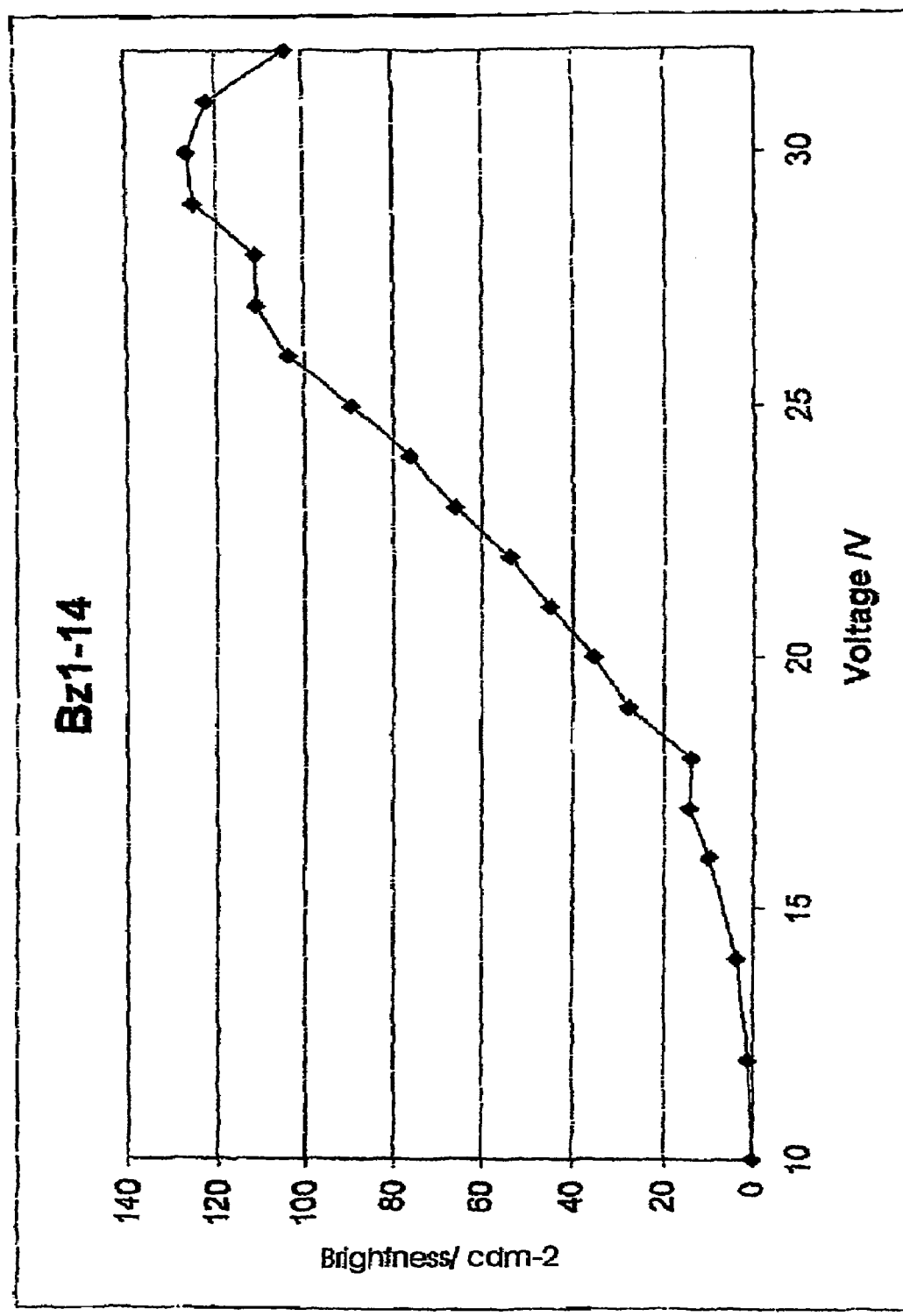
FIGS. 23 and 24 are plots similar to FIGS. 21 and 22 for the device of Example 3b as described in this application.
Figure 24:
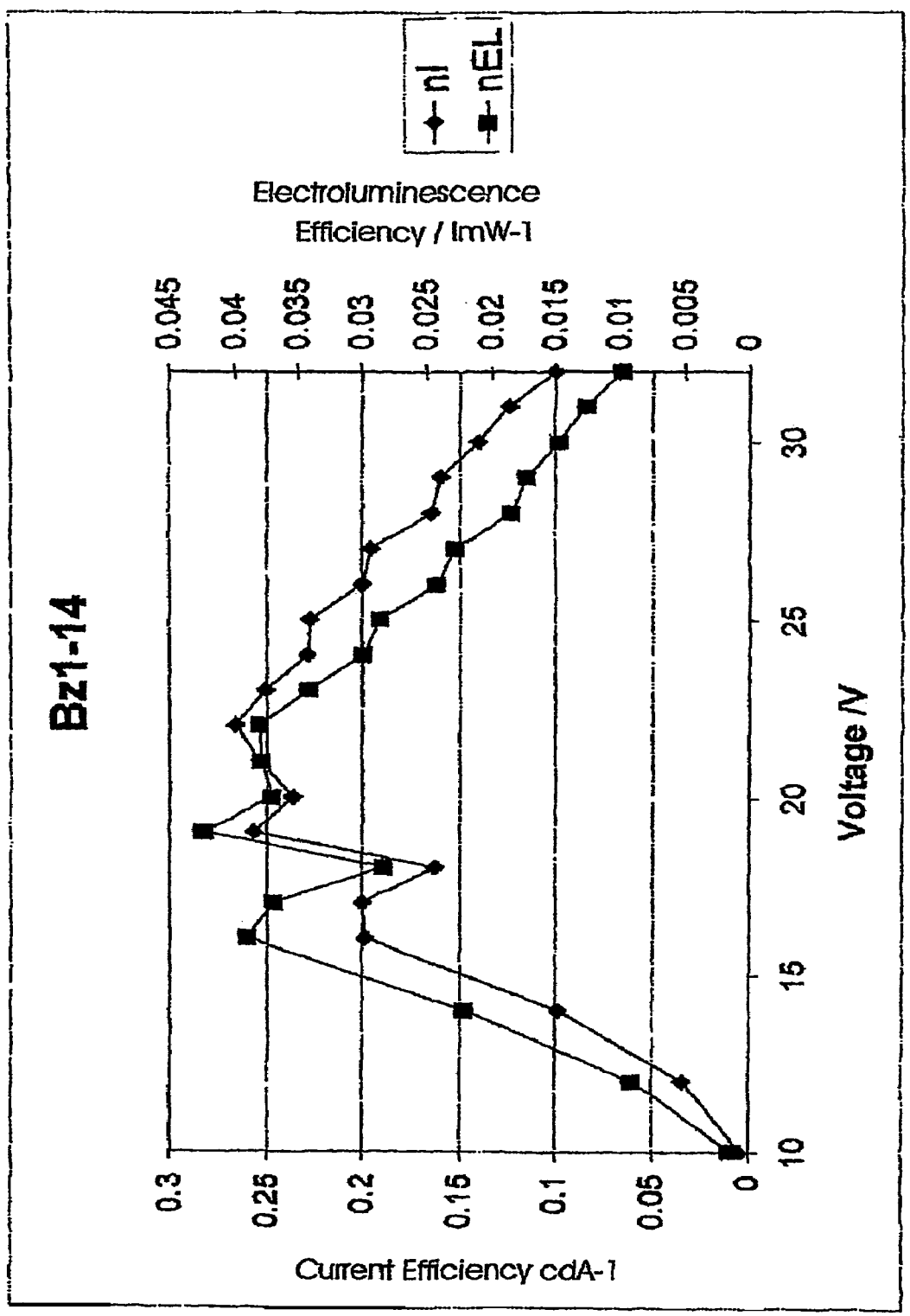

The results are shown graphically in FIGS. 23 and 24

EXAMPLE 3c

Other devices were fabricated as above with the structure 47Ω ITO and Al electrodes

| Material | CuPc | β-NPB | EuZn(DBM)$_5$(OPNP) | BCP | Alq$_3$ | LiF |
|---|---|---|---|---|---|---|
| Thickness/nm | 2.0 | 8.5 | 55.0 | 6.0 | 17.0 | 0.9 |

The electroluminescent properties were

| Voltage/V | Current/mA | Current Density/mAcm$^{-2}$ | x, y | Brightness/cdm$^{-2}$ | Current Efficiency/cdA$^{-1}$ | Electroluminescent Efficiency/lmW$^{-1}$ |
|---|---|---|---|---|---|---|
| 16.0 | 0.81 | 13.60 | 0.59, 0.40 | 29.74 | 0.22 | 0.043 |

Figure 25:
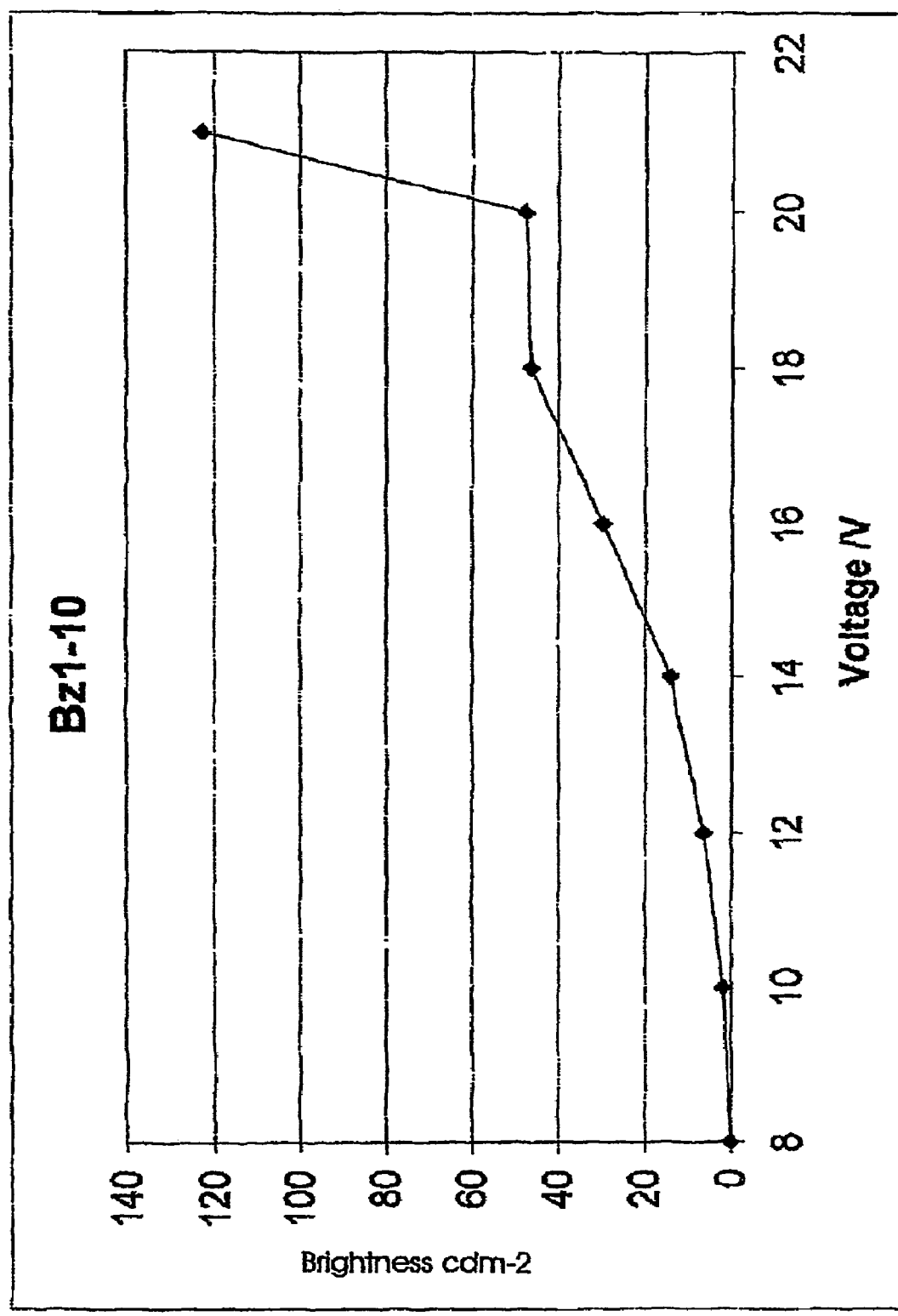
FIGS. 25 and 26 are plots similar to FIGS. 23 and 24 for the device of Example 3c as described in this application.
Figure 26:
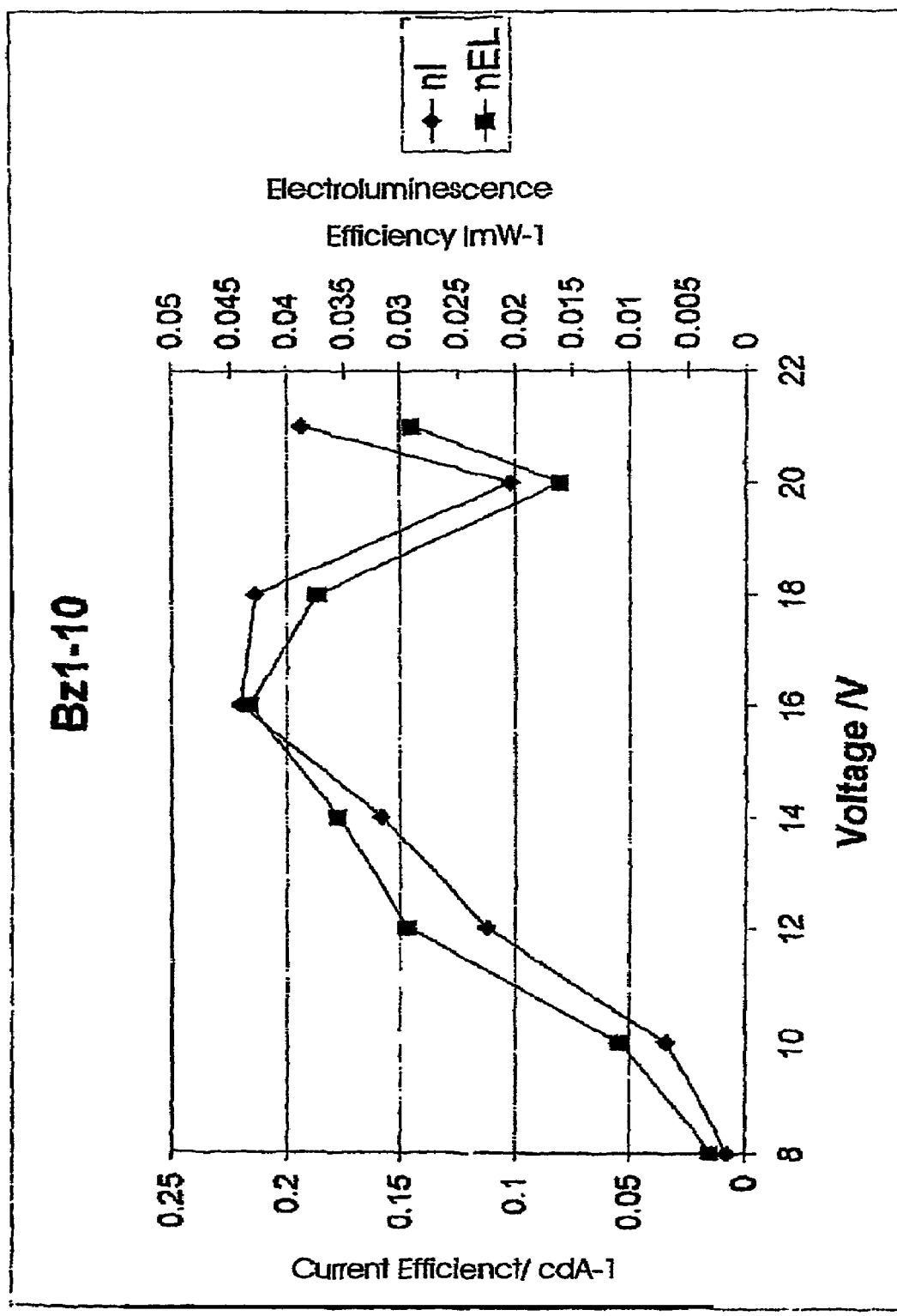

The results are shown graphically in FIGS. 25 and 26

EXAMPLE 4

Electroluminescent Device

Figure 20:
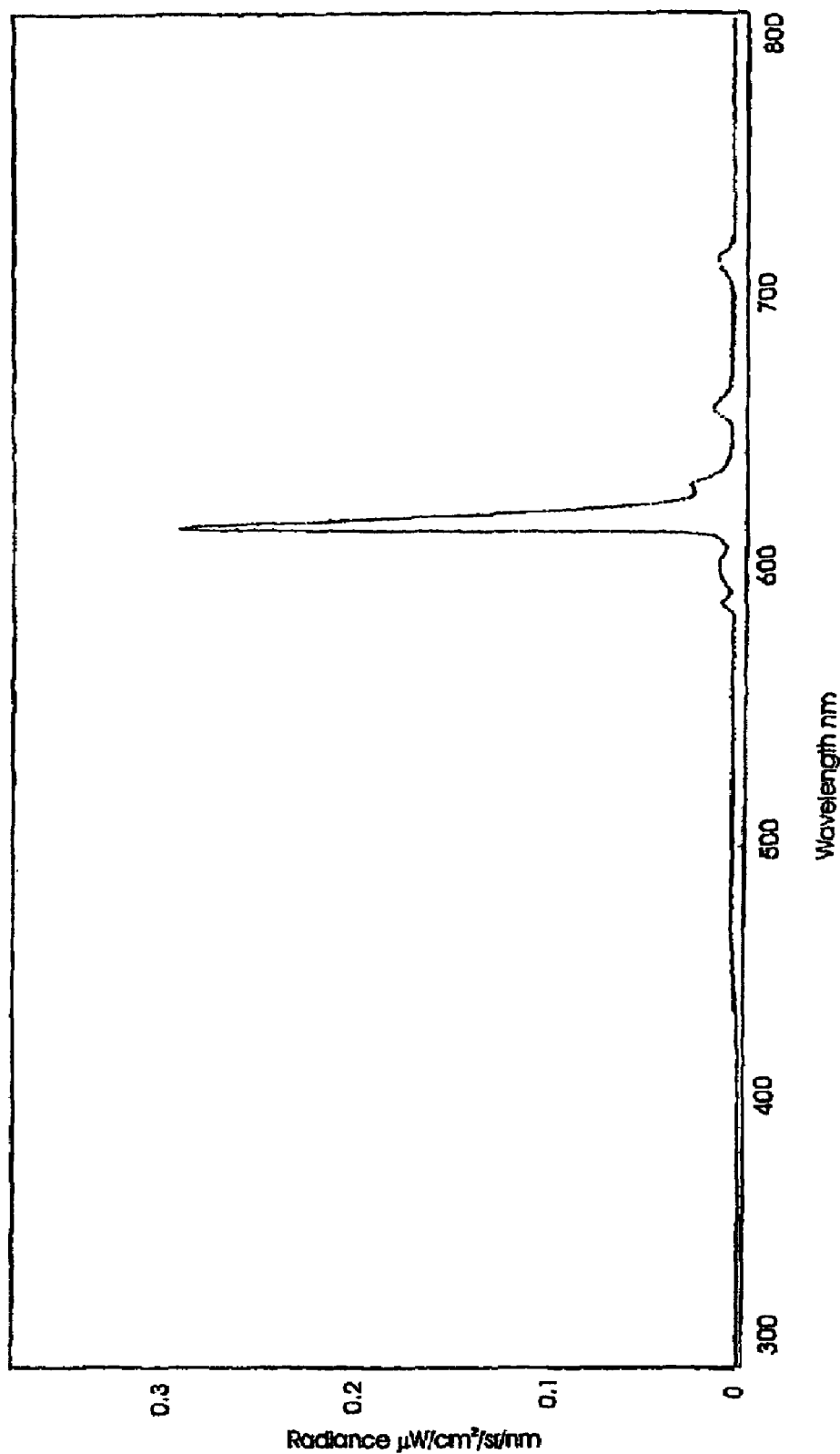
FIG. 20 is a plot of radiance against wavelength for the device of Example 4 as described in this application.
Figure 21:
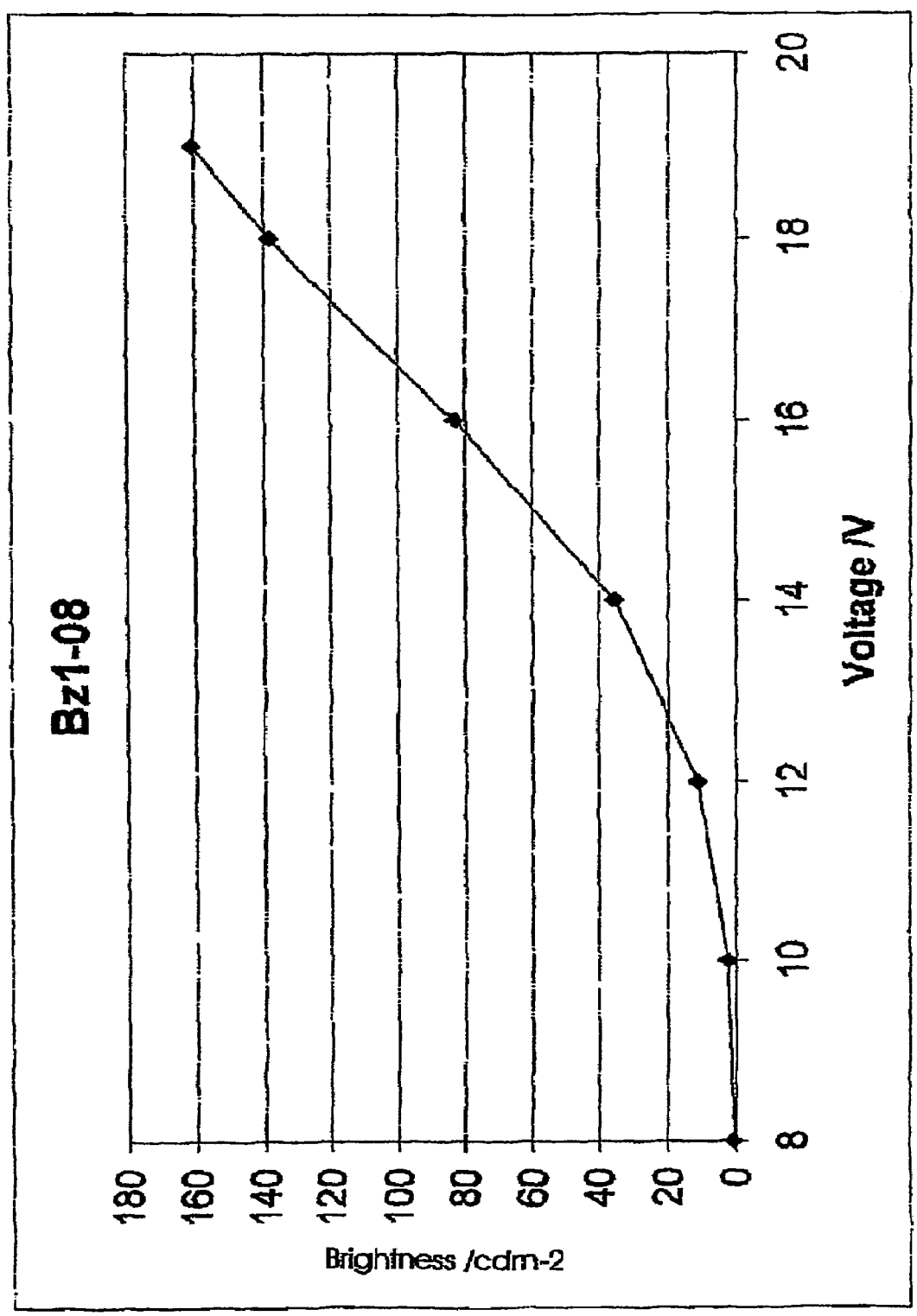
FIGS. 21 and 22 are, respectively, plots of brightness and currency efficiency against voltage for the device of Example 3a as described in this application.
Figure 22:
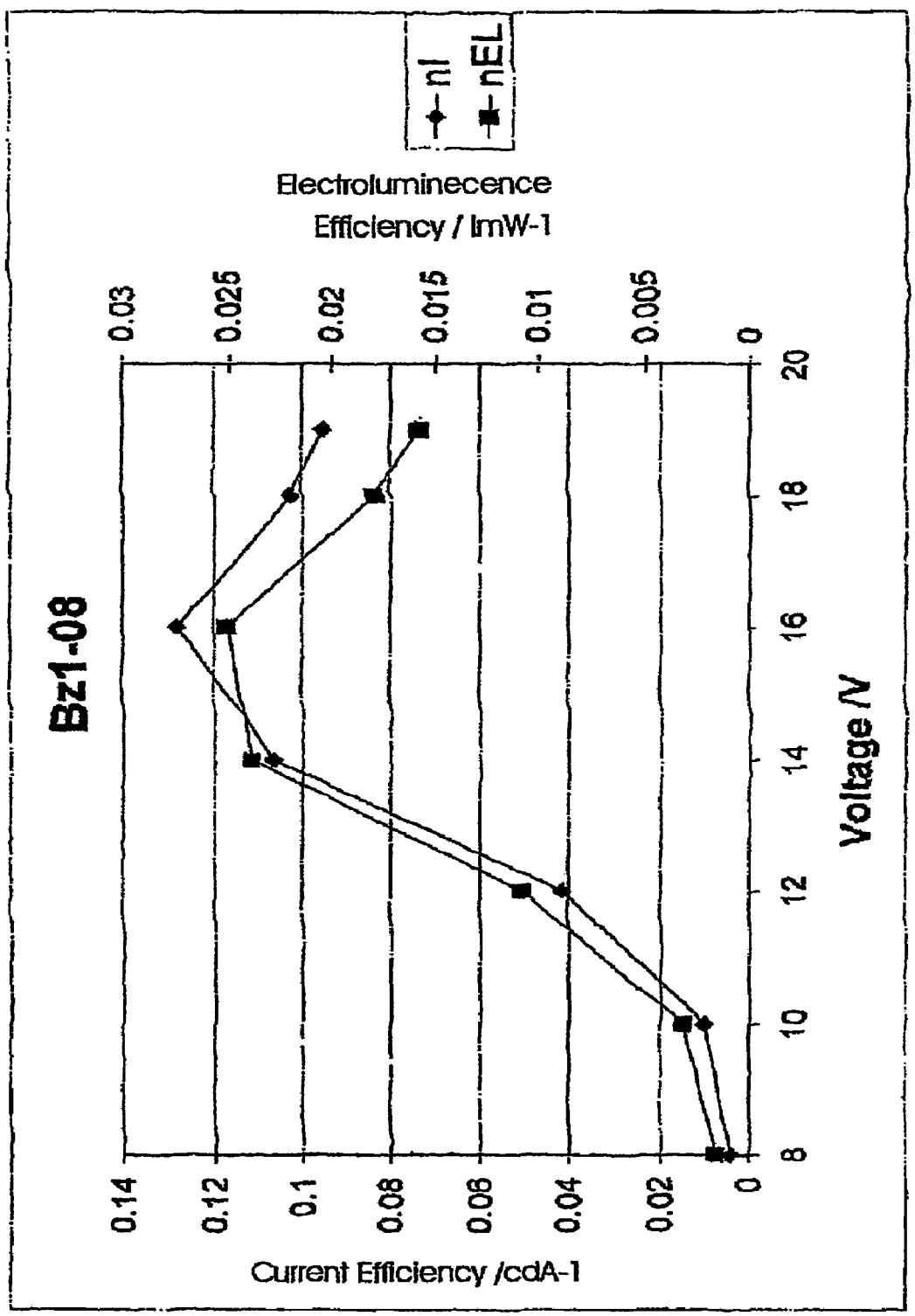

Example 3 was repeated using EuAl(DBM)$_6$OPNP prepared as in Example 2 and the plot of radiance against wavelength is shown in FIG. 20 and the colour coordinates according to the CIE colour chart were x=0.60622; y=0.3224 which is reddish orange.

EXAMPLE 4a

Other devices were fabricated as above with the structure 100Ω ITO and Al electrodes

| Material | CuPc | α-NPB | EuAl(DBM)$_6$OPNP | BCP | Alq$_3$ | LiF |
|---|---|---|---|---|---|---|
| Thickness/nm | 2.2 | 18.3 | 55.0 | 6.0 | 12.0 | 0.9 |

The electroluminescent properties were

| Voltage/V | Current/mA | Current Density/mAcm$^{-2}$ | x, y | Brightness/cdm$^{-2}$ | Current Efficiency/cdA$^{-1}$ | Electroluminescent Efficiency/lmW$^{-1}$ |
|---|---|---|---|---|---|---|
| 21.0 | 3.60 | 60.0 | 0.43, 0.42 | 528.0 | 0.132 | 0.0880 |

Figure 27:
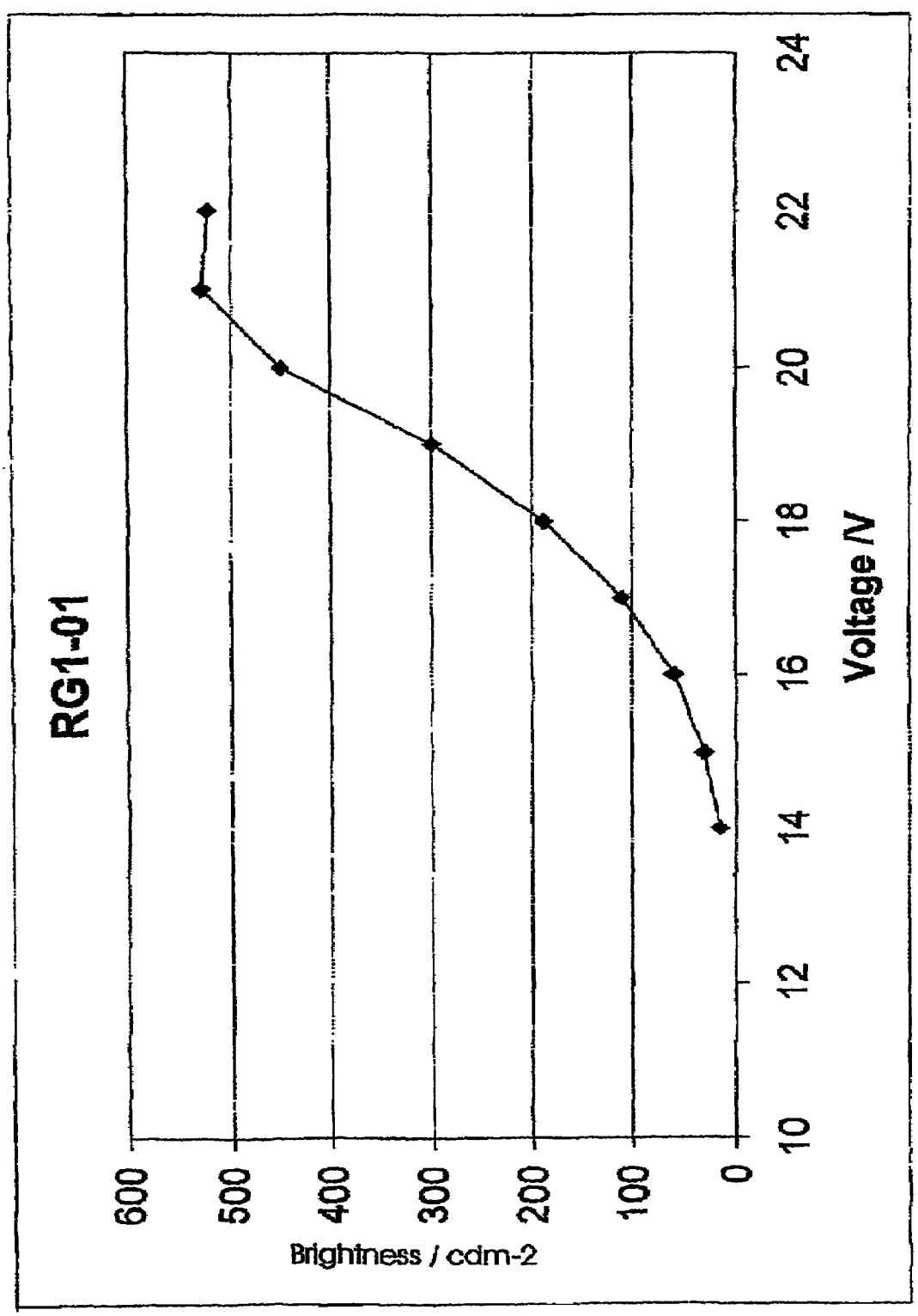
FIGS. 27 and 28 are plots similar to FIGS. 25 and 26 for the device of Example 4a as described in this application.
Figure 28:
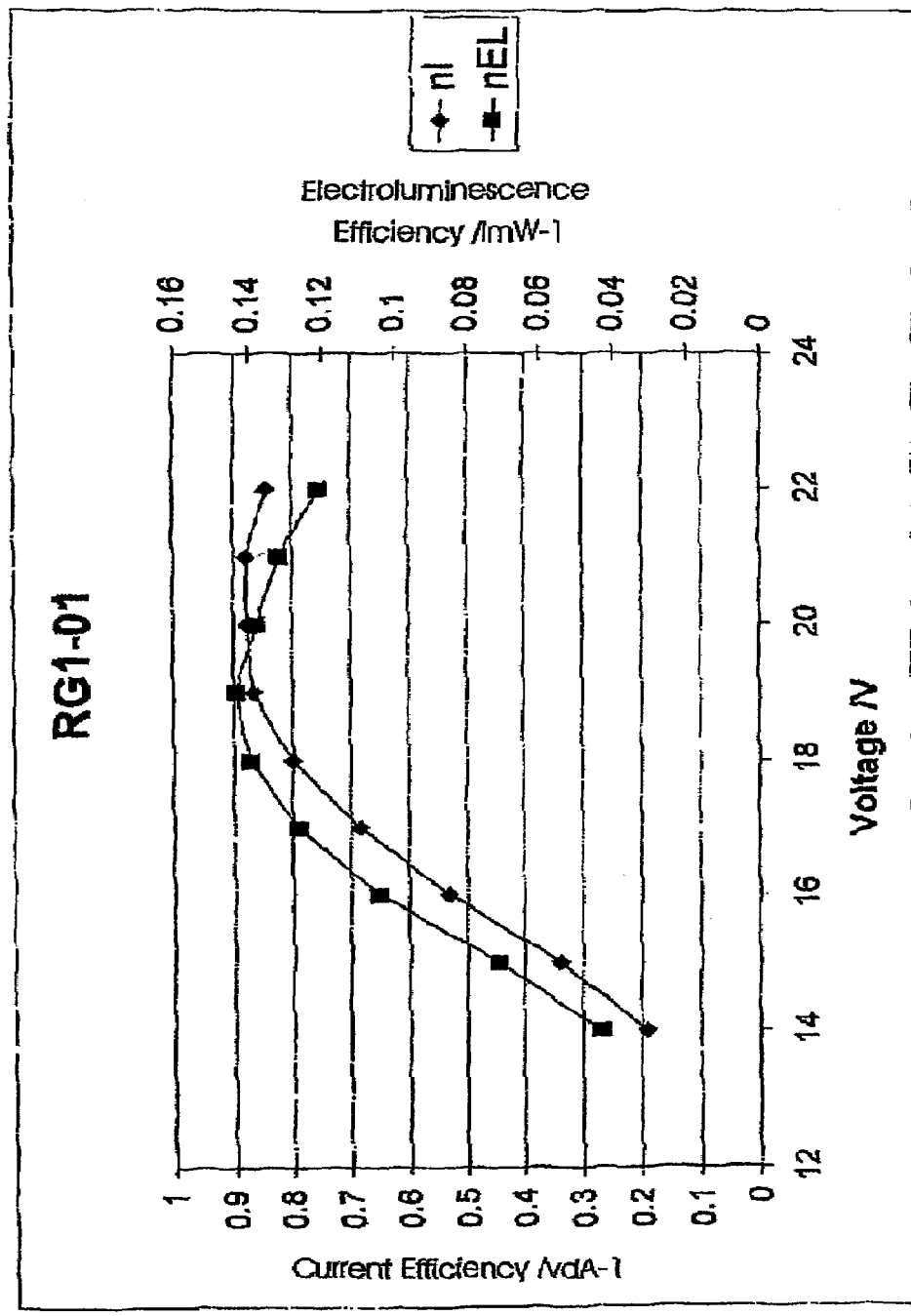

The results are shown graphically in FIGS. 27 and 28

EXAMPLE 5

Example 4 was repeated using EuSc(DBM)$_6$OPNP 47Ω ITO and Al electrodes

| Material | CuPc | α-NPB | EuSc(DBM)$_6$OPNP | BCP | Alq$_3$ | LiF |
|---|---|---|---|---|---|---|
| Thickness nm | 2.1 | 8.5 | 54.9 | 6.0 | 17.5 | 1.0 |

The electroluminescent properties were

| Voltage/ V | Current/ mA | Current Density/ mAcm$^{-2}$ | x, y | Brightness/ cdm$^{-2}$ | Current Efficiency/ cdA$^{-1}$ | Electroluminescent Efficiency/lmW$^{-1}$ |
| --- | --- | --- | --- | --- | --- | --- |
| 22.0 | 3.60 | 60.0 | 0.38, 0.37 | 43.79 | 0.73 | 1.04 × 10$^{-2}$ |

Figure 29:
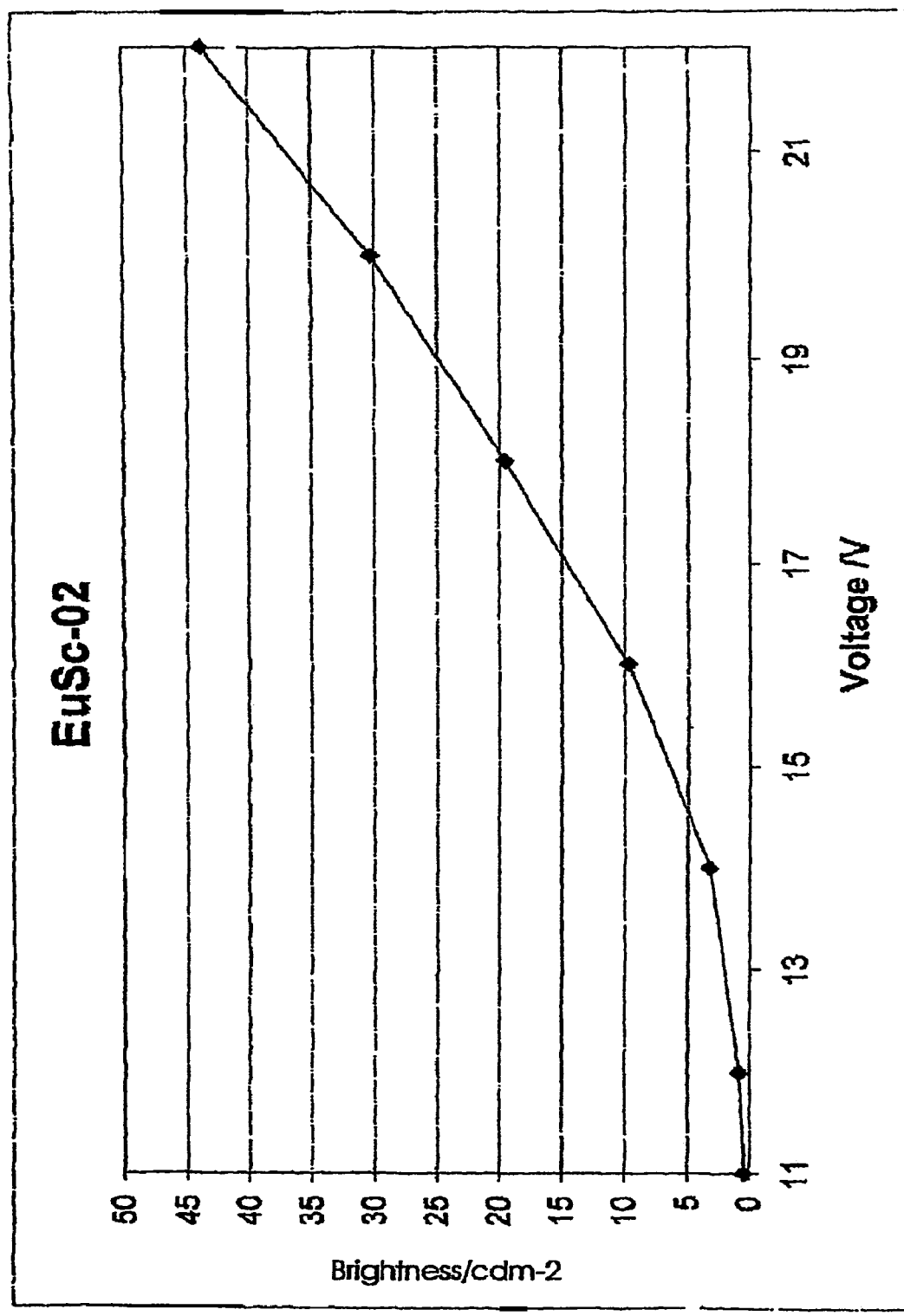
FIGS. 29 and 30 are plots similar to FIGS. 27 and 28 for the device of Example 5 as described in this application.
Figure 30:
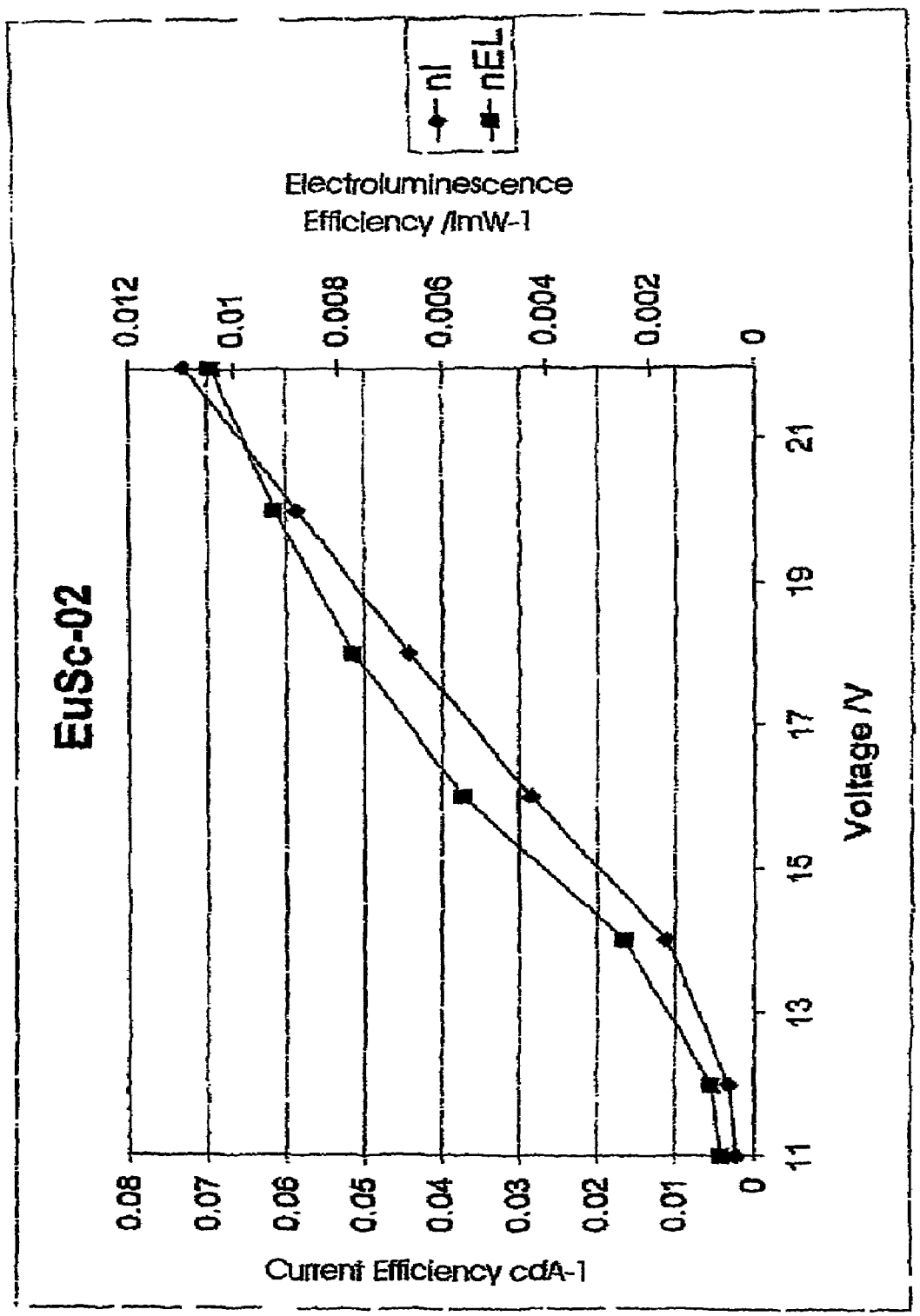

The results are shown graphically in FIGS. 29 and 30.

The invention claimed is:

1. An electroluminescent device comprising:
   (i) a first electrode;
   (ii) a second electrode: and,
   (iii) a layer of an electroluminescent material positioned between said first and second electrodes, wherein said electroluminescent material is selected from the group consisting of materials having the general chemical formula $(L_\alpha)_n M_1 M_2$ and materials having the general chemical formula $(L_\alpha)_n M_1 M_2 (L_p)$ wherein:

$M_1$ is selected from the group consisting of Sm(III), Eu(II), Eu(III), Tb(III), Dy(III), Yb(III), Lu(III), Gd(III), Tm(III), Th(IV), Ce(III), Ce(IV), Pr(III), Nd(III), Pm(III), Dy(III), Ho(III) or Er(III);

$M_2$ is selected from the group consisting of lithium, sodium, potassium, rubidium, caesium, magnesium, calcium, strontium, barium, boron, aluminum, gallium, indium, germanium, tin, lead, scandium, titanium, vanadium, chromium, nickel, copper, zinc, yttrium, zirconium, niobium, molybdenum, ruthenium, rhodium, palladium, silver, cadmium, tantalum, osmium, iridium, platinum and gold;

n is an integer equal to the combined valence state of $M_1$ and $M_2$;

$L_\alpha$ is selected from the group of materials consisting of (a) to (f) as follows:

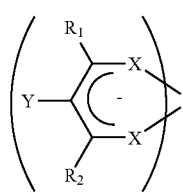
(a)

wherein $R_1$ and $R_2$ can be the same or different and are independently selected from the group consisting of hydrogen; substituted or unsubstituted aliphatic groups; substituted or unsubstituted aromatic, heterocyclic or polycyclic ring structures; fluorocarbon groups; and halogens;

X is selected from the group consisting of Se, S, and O; and,

Y is selected from the group consisting of hydrogen; substituted or unsubstituted aliphatic groups; substituted or unsubstituted aromatic, heterocyclic or polycyclic ring structures; fluorocarbon groups; halogens; and nitrile;

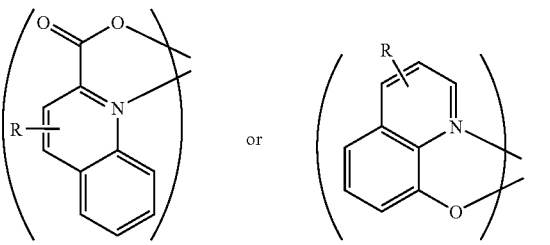
(b)

wherein R is selected from the group consisting of hydrocarbyl groups, aliphatic groups, aromatic groups, heterocyclic groups, carboxy groups, aryloxy groups, hydroxy groups and alkoxy groups;

(c)

wherein $R_5$ is selected from the group consisting of substituted or unsubstituted aromatic groups, heterocyclic groups and polycyclic rings;

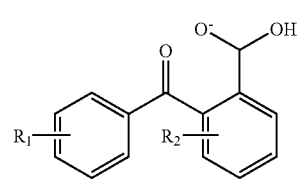
(d)

wherein $R_1$ and $R_2$ are as defined in (a) above;

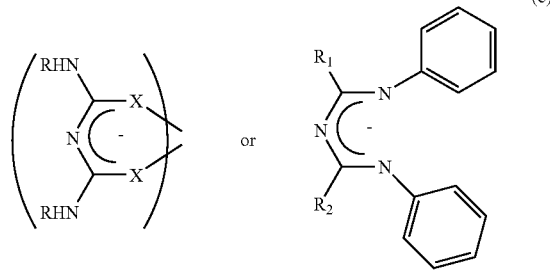
(e)

wherein $R_1$ and $R_2$ are as defined in (a) above; and,

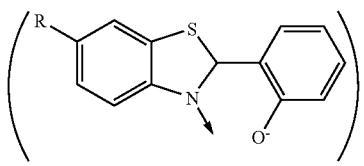
(f)

wherein R is selected from the group consisting of hydrocarbyl groups, aliphatic groups, aromatic groups, heterocyclic groups, carboxy groups, aryloxy groups, hydroxyl groups and alkoxy groups; and, Lp is selected from the group of materials consisting of (g) to (jj) as follows:

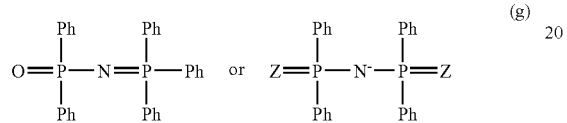
(g)

wherein each Ph group can be the same or different and are independently selected from the group consisting of substituted or unsubstituted aromatic groups and substituted or unsubstituted heterocyclic or polycyclic groups with substituents selected from alkyl, aralkyl, alkoxy, aromatic, heterocyclic, and polycyclic groups, halogens, cyano groups, and substituted or unsubstituted amino groups; and, Z is selected from O and S;

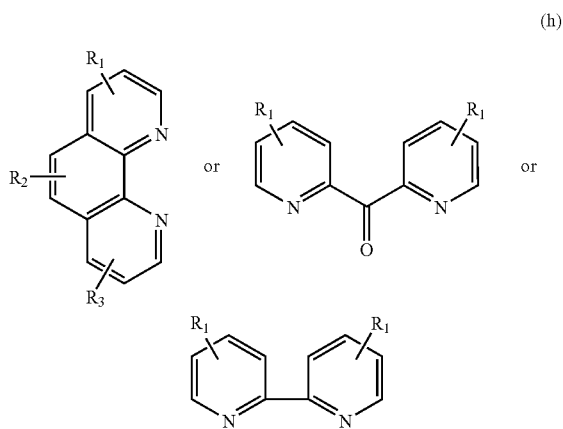
(h)

wherein $R_1$, $R_2$ and $R_3$ can be the same or different and are independently selected from the group consisting of hydrogen; substituted or unsubstituted aliphatic groups; substituted and unsubstituted aromatic, heterocyclic and polycyclic ring structures; fluorocarbon groups and halogens;

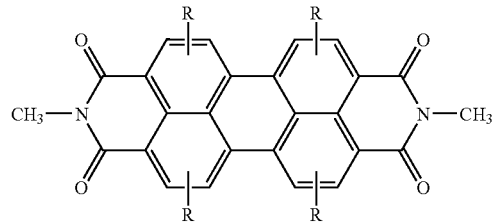
(i)

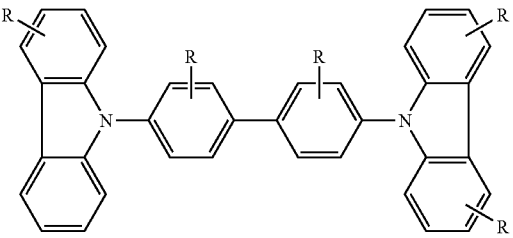
(j)

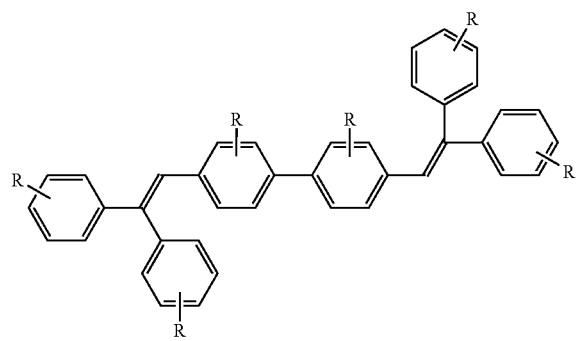
(k)

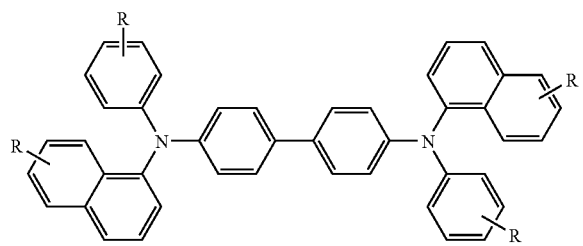
(l)

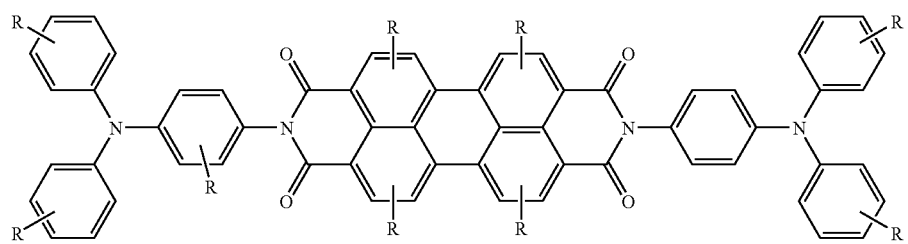
(m)

-continued
(n)
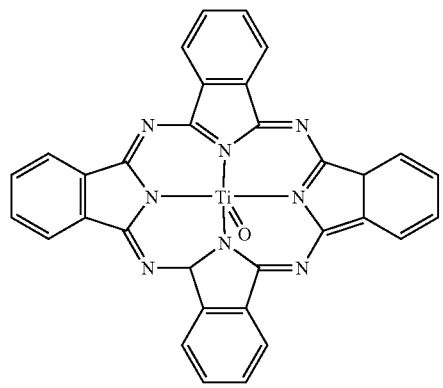
(o)
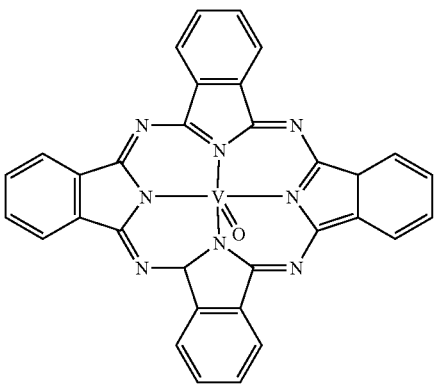
(p)
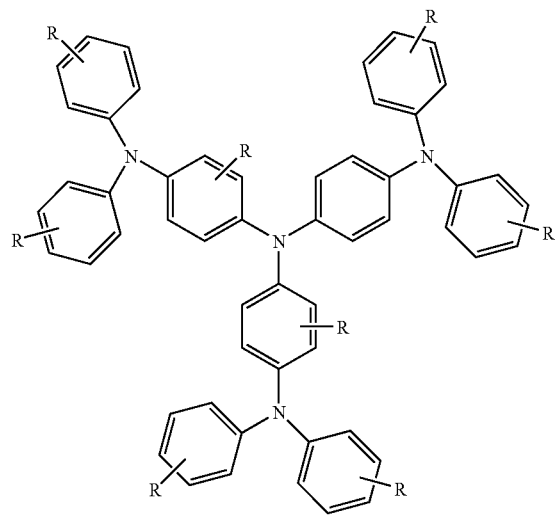
(q)
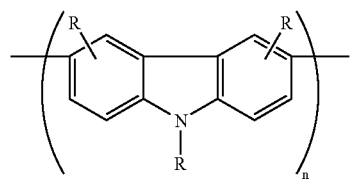
(r)
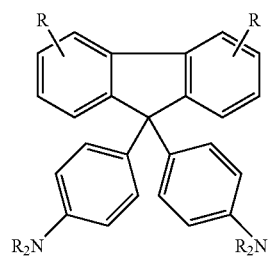
(s)
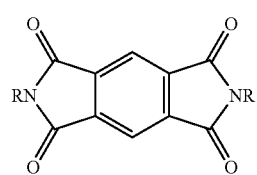
(t)
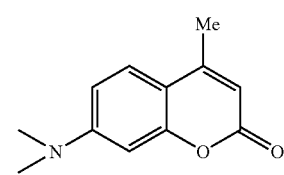

-continued
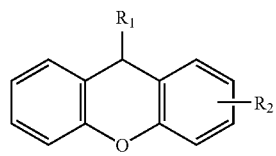
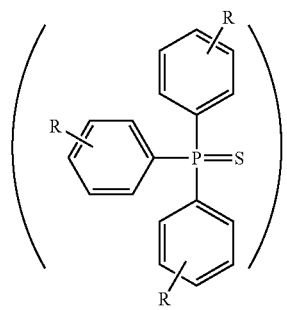
(x)
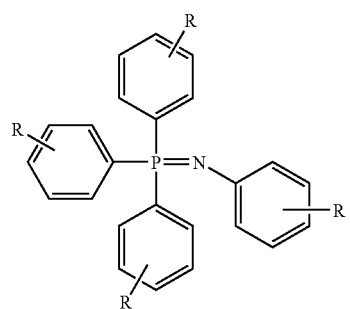
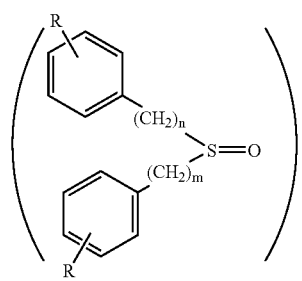
(y)
(z)
(aa)
m = 0, 1, 2 etc.
n = 0, 1, 2 etc.
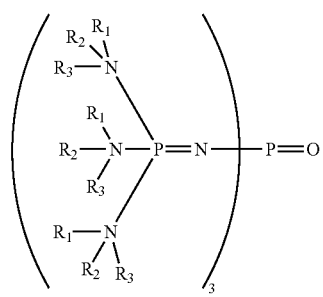
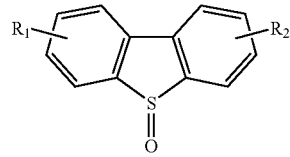
(bb)
(cc)
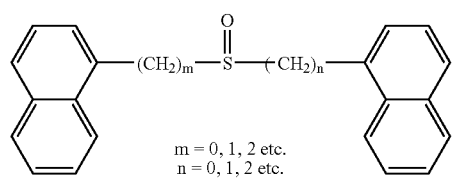
(dd)
m = 0, 1, 2 etc.
n = 0, 1, 2 etc.
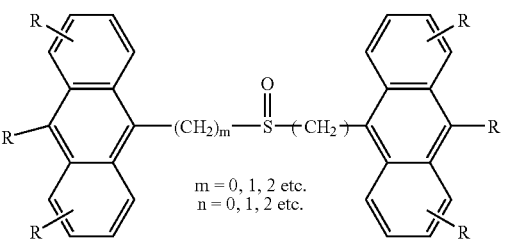
(ee)
m = 0, 1, 2 etc.
n = 0, 1, 2 etc.
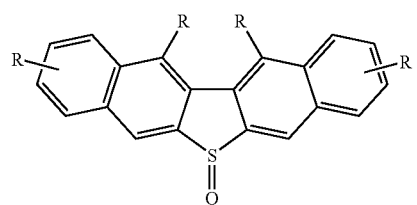
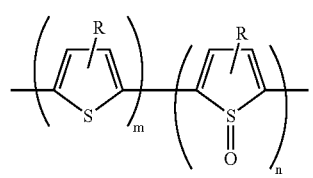
(ff)
(gg)
m = 0, 1, 2 etc.
n = 0, 1, 2 etc.

(hh)

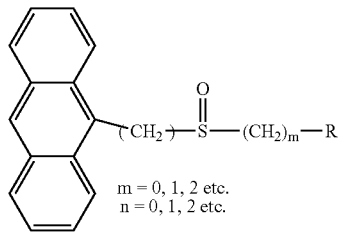

m = 0, 1, 2 etc.
n = 0, 1, 2 etc.

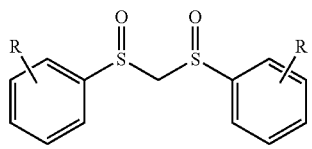

-continued

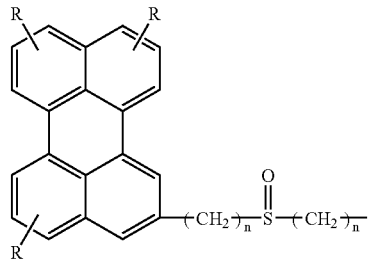

(ii)

wherein R is selected from the group consisting of hydrocarbyl groups, aliphatic groups, aromatic groups, heterocyclic groups, carboxy groups, aryloxy groups, hydroxyl groups and alkoxy groups.

2. The electroluminescent device according to claim 1 wherein the electroluminescent material comprises EuZn (DBM)$_5$OPNP.

3. The electroluminescent device according to claim 1 wherein the electroluminescent material comprises EuAl (DBM)$_6$OPNP.

4. The electroluminescent device according to claim 1 wherein the electroluminescent material comprises EuSc (DBM)$_6$OPNP.

5. The electroluminescent device according to claim 1 wherein a layer of a hole transmitting material is positioned between the first electrode and the layer of the electroluminescent material.

6. The electroluminescent device according to claim 5 wherein the hole transmitting layer is formed from a material selected from the group consisting of poly(vinylcarbazole), N,N'-diphenyl-N,N'-bis(3-methylphenyl)-1,1'-biphenyl-4,4'diamine (TPD), polyaniline, and a substituted polyaniline.

7. The electroluminescent device according to claim 1 wherein a layer of an electron transmitting material is positioned between the second electrode and the layer of electroluminescent material.

8. The electroluminescent device according to claim 7 wherein the electron transmitting material is a metal quinolate.

9. The electroluminescent device according to claim 8 wherein the metal quinolate is selected from the group consisting of lithium quinolate, sodium quinolate, potassium quinolate, zinc quinolate, magnesium quinolate and aluminum quinolate.

10. The electroluminescent device according to claim 1 wherein a layer of a hole transmitting material is positioned between the first electrode and the layer of the electroluminescent material, and further wherein a layer of an electron transmitting material is positioned between the second electrode and the layer of electroluminescent material.

11. The electroluminescent device according to claim 10 wherein the hole transmitting layer comprises a copper phthalocyanine layer and the electron transmitting layer comprises lithium fluoride.

\* \* \* \* \*